United States Patent [19]

Honda et al.

[11] Patent Number: 5,873,177
[45] Date of Patent: Feb. 23, 1999

[54] SPIN DRYER AND SUBSTRATE DRYING METHOD

[75] Inventors: Yoshiyuki Honda, Saga-ken; Yoshio Kumagai, Yamanashi-ken, both of Japan

[73] Assignee: Tokyo Electron Limited, Tokyo, Japan

[21] Appl. No.: 859,840

[22] Filed: May 19, 1997

[30] Foreign Application Priority Data

| May 20, 1996 | [JP] | Japan | ................................ | 8-147898 |
| May 20, 1996 | [JP] | Japan | ................................ | 8-147899 |
| May 20, 1996 | [JP] | Japan | ................................ | 8-147900 |

[51] Int. Cl.⁶ .................................................. F26B 17/24
[52] U.S. Cl. .............................................. 34/58; 118/715
[58] Field of Search .................................. 34/58; 118/715

[56] References Cited

U.S. PATENT DOCUMENTS

| 4,677,758 | 7/1987 | Aigo ............................................ | 34/58 |
| 4,990,374 | 2/1991 | Keeley et al. ........................... | 118/715 |
| 5,435,075 | 7/1995 | Shiraishi et al. . | |

FOREIGN PATENT DOCUMENTS

| 63-180925 | 11/1988 | Japan . |
| 5-43472 | 11/1993 | Japan . |
| 6-97148 | 4/1994 | Japan . |
| 7-176512 | 7/1995 | Japan . |

*Primary Examiner*—Ronald Capossela
*Attorney, Agent, or Firm*—Oblon, Spivak, McClelland, Maier & Neustadt, P.C.

[57] ABSTRACT

A spin dryer for centrifugally removing water droplets attached to a plurality of substrates comprises a rotor having a main shaft formed in a lower portion, substrate holding means for holding a plurality of substrates such that main surfaces of the substrates are perpendicular to the main shaft of the rotor, the holding means being positioned in symmetry with respect to the main shaft of the rotor and rotated together with the rotor, a treating vessel surrounding the rotor and the substrate holding means, an air inlet port formed in an upper portion of the treating vessel for introducing air into the treating vessel, and an exhaust port formed in a side portion of the treating vessel in a manner to extend upward from the bottom portion of the treating vessel to reach at least the height position of the rotor.

26 Claims, 21 Drawing Sheets

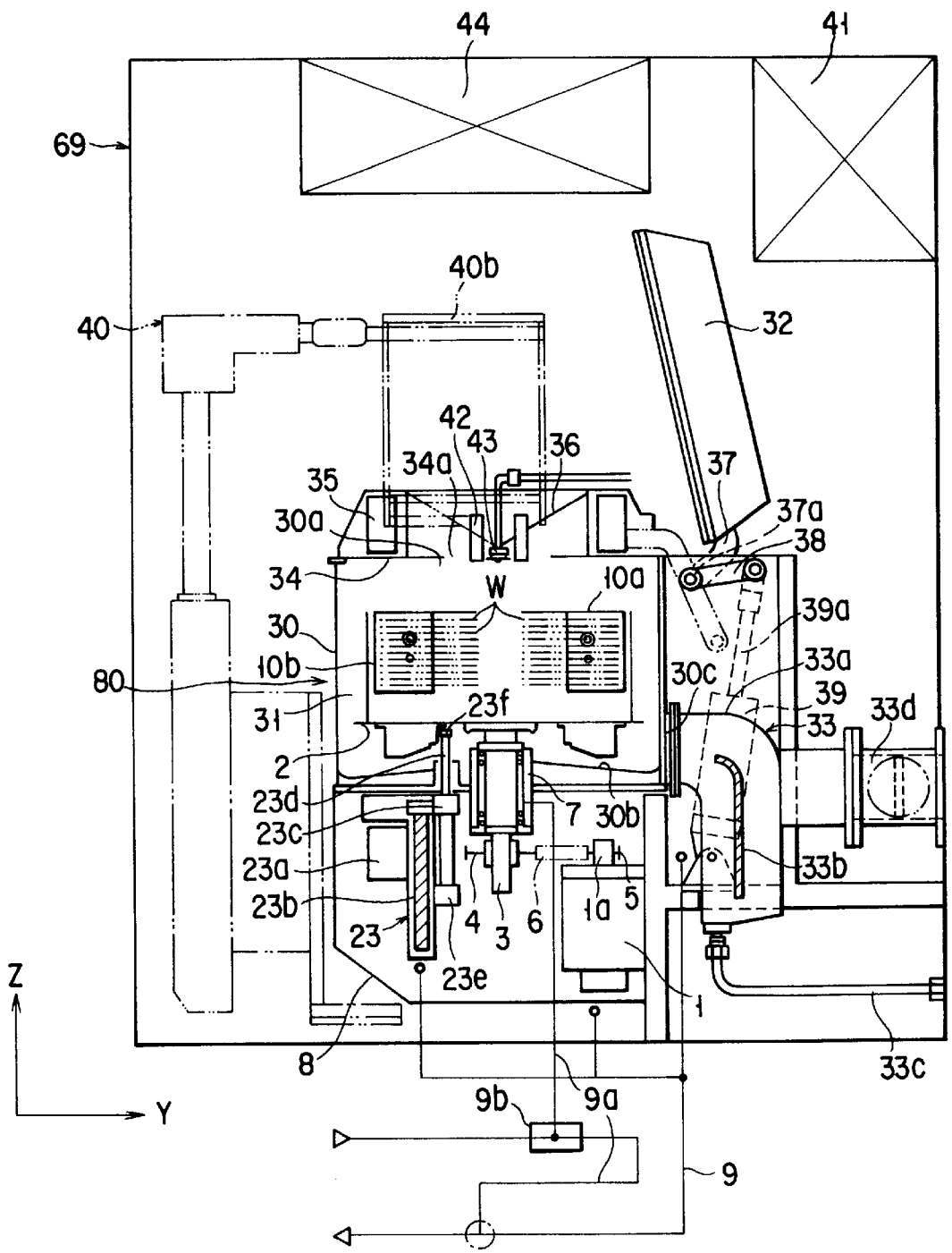
F I G. 2

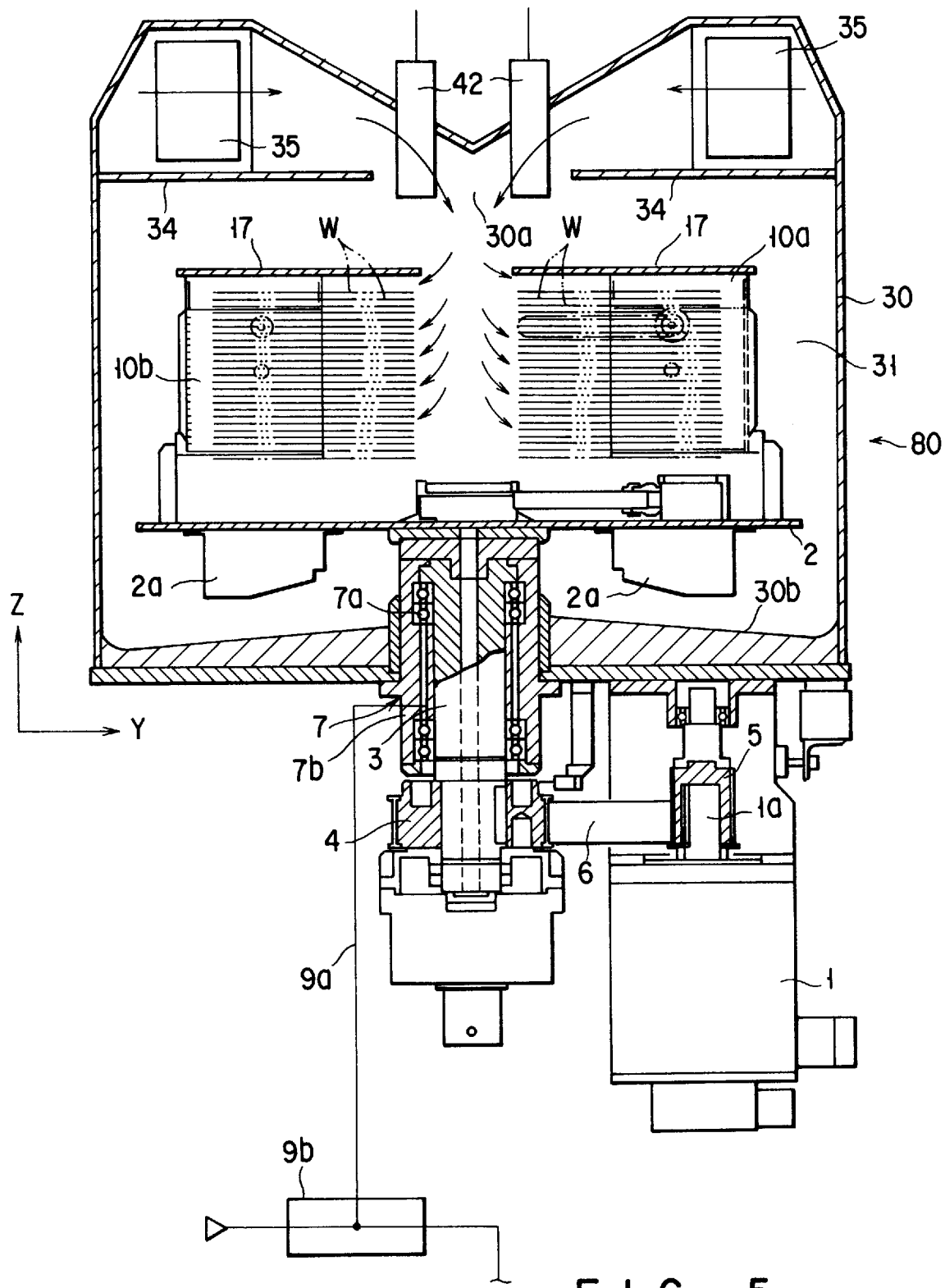
F I G. 5

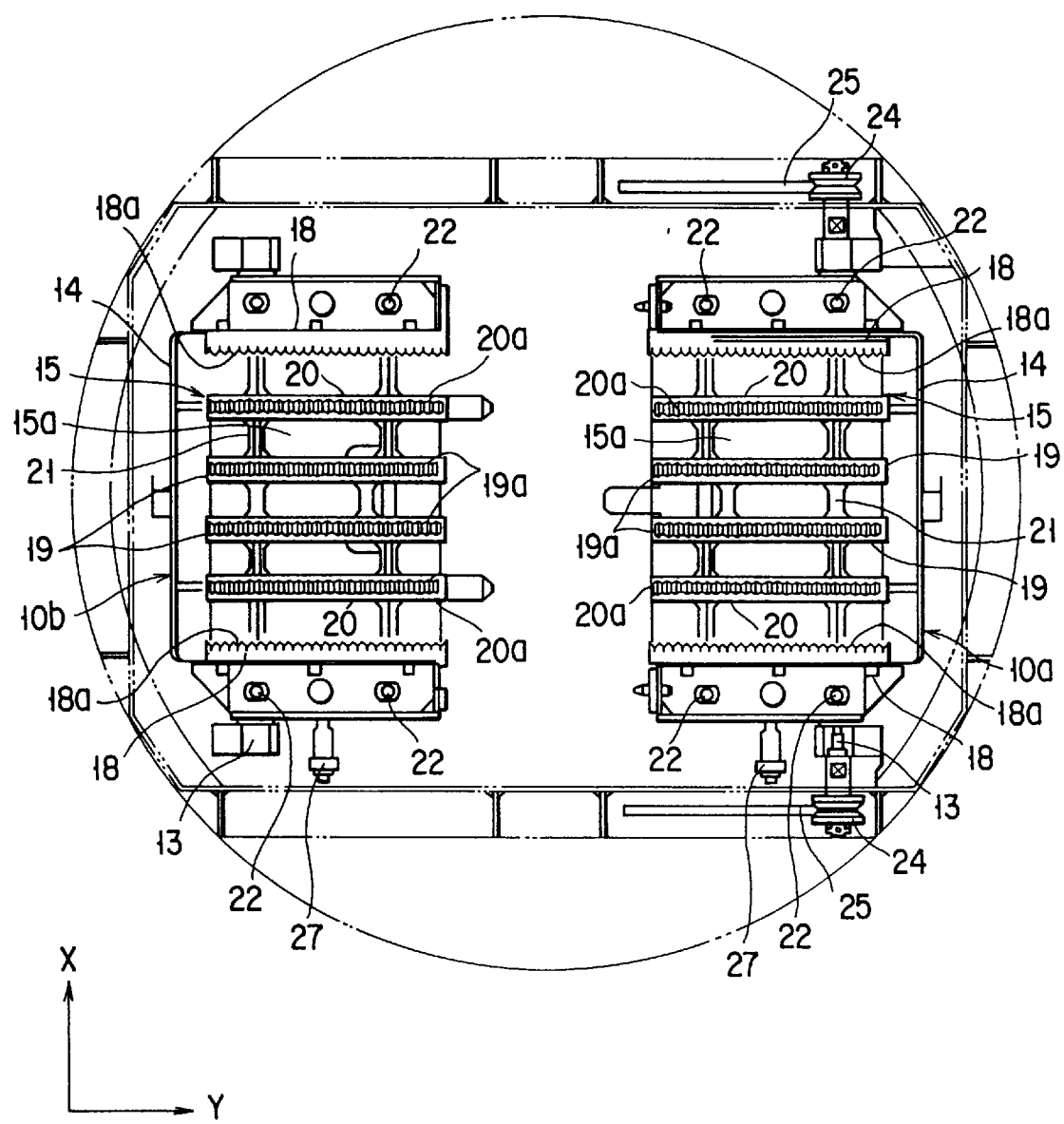
F I G. 10

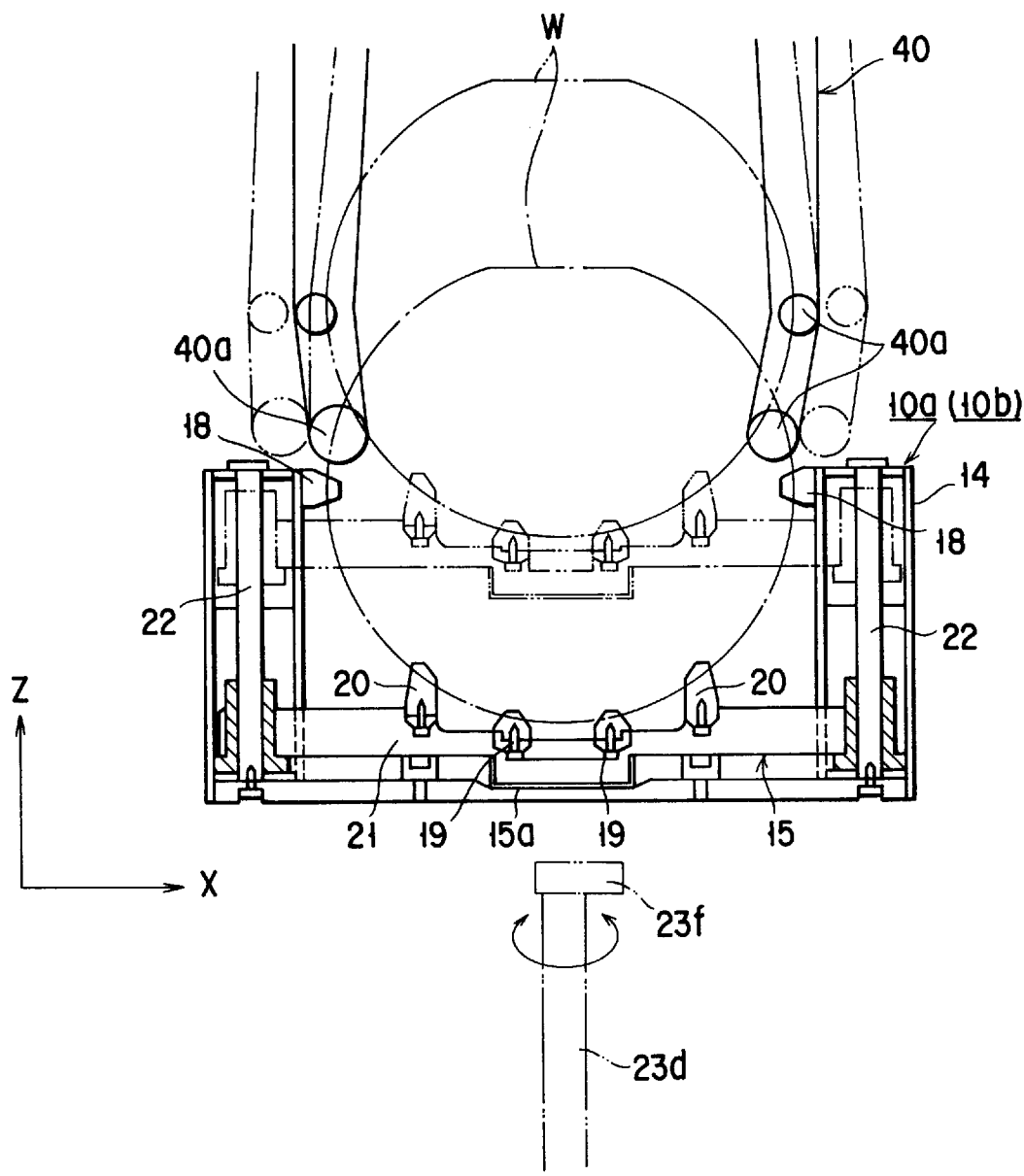
F I G. 13

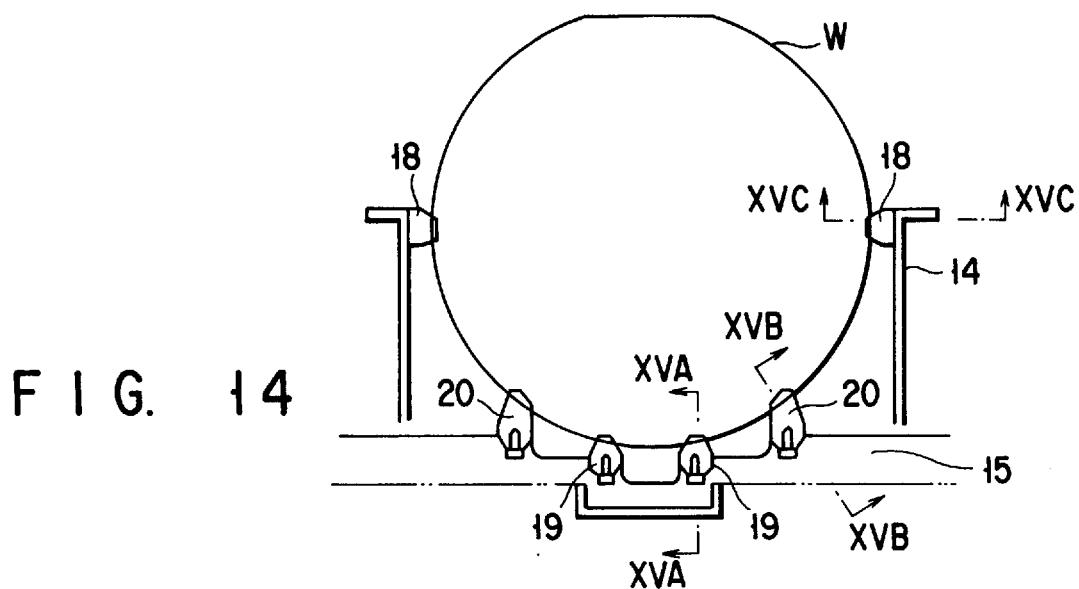
FIG. 14
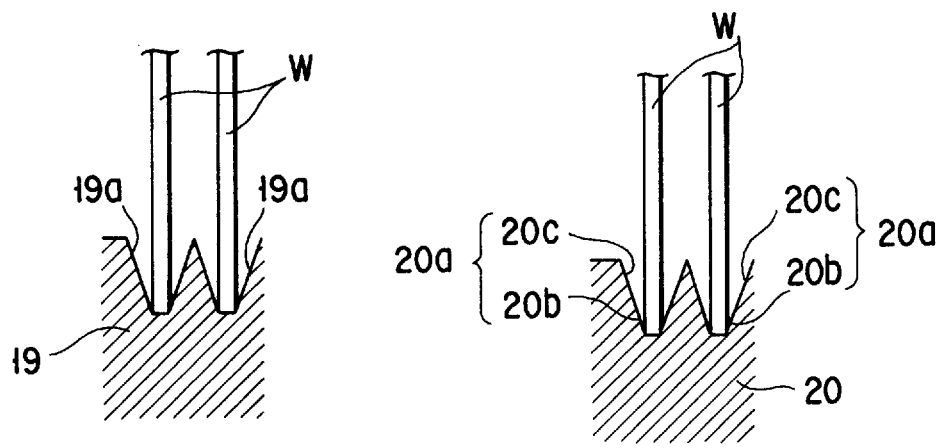
FIG. 15A
FIG. 15B
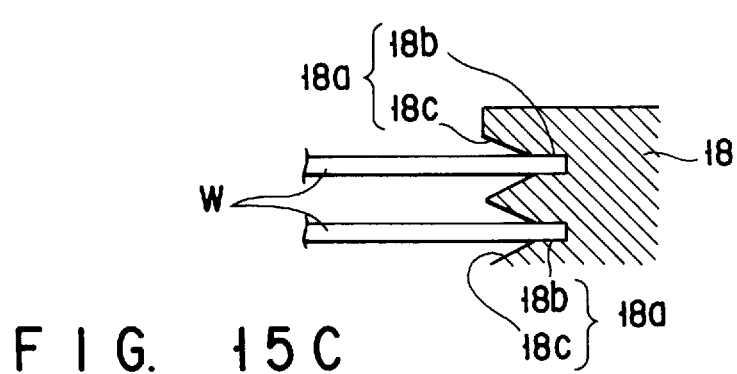
FIG. 15C

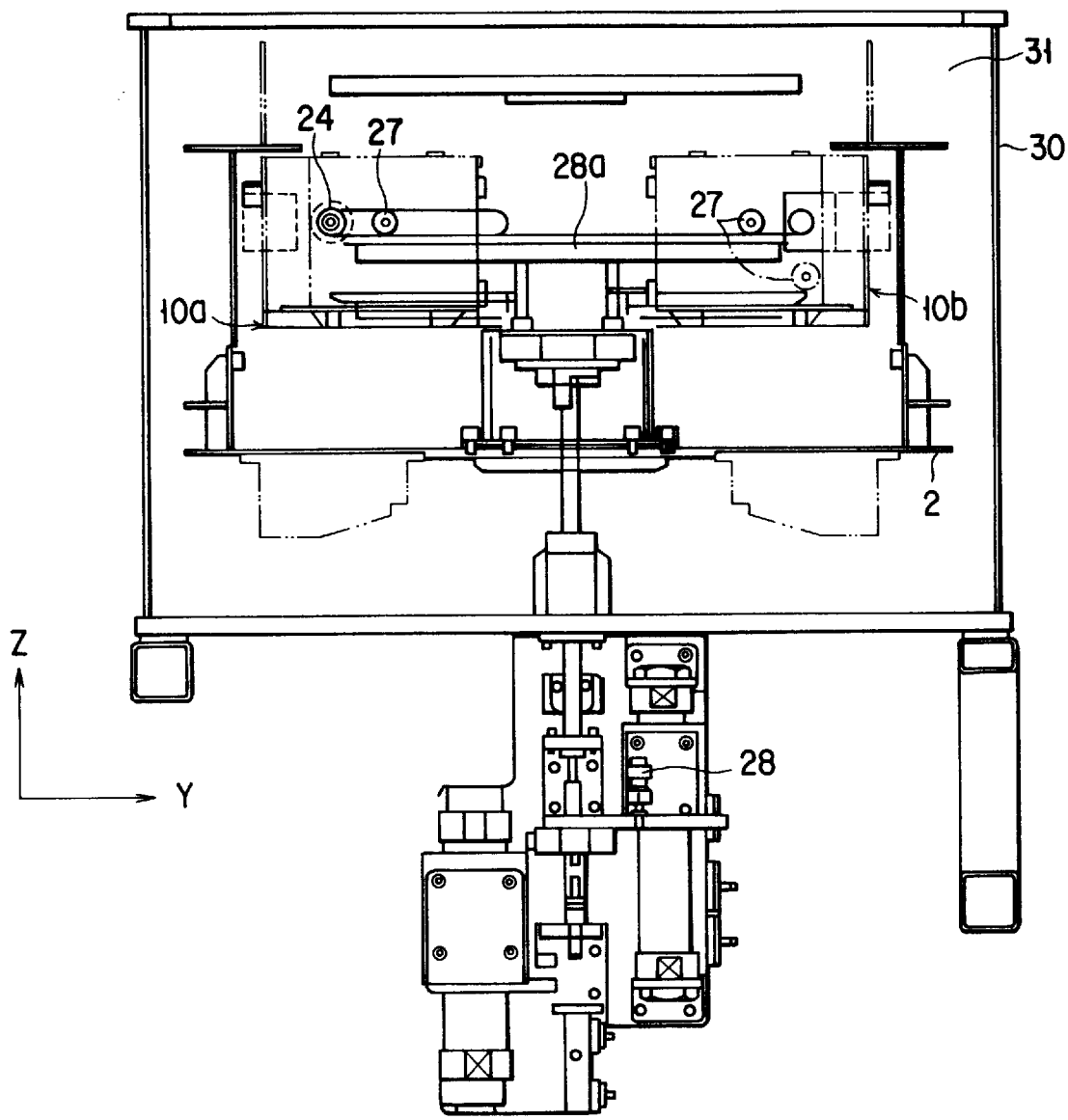
F I G. 17

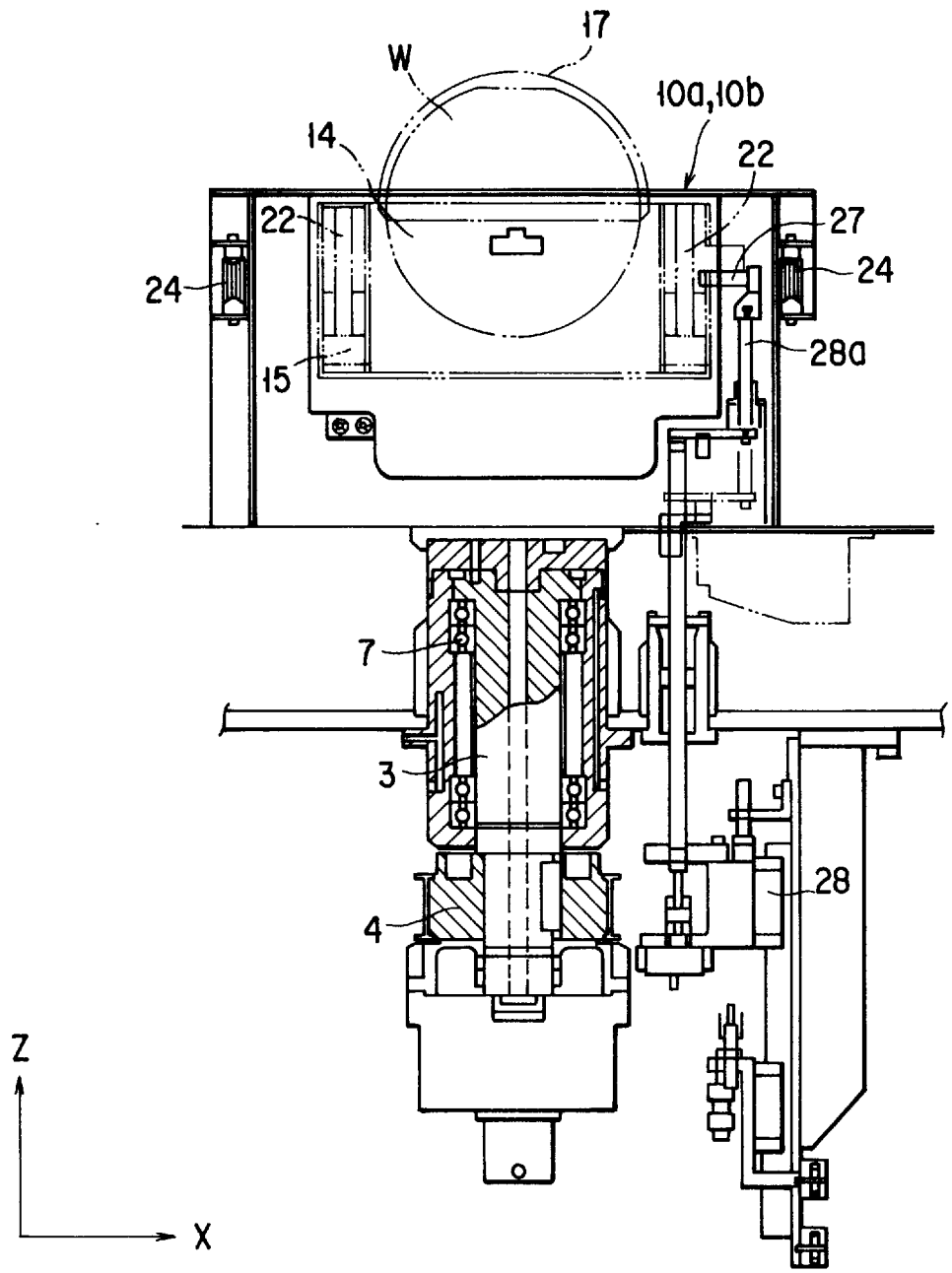
F I G. 18

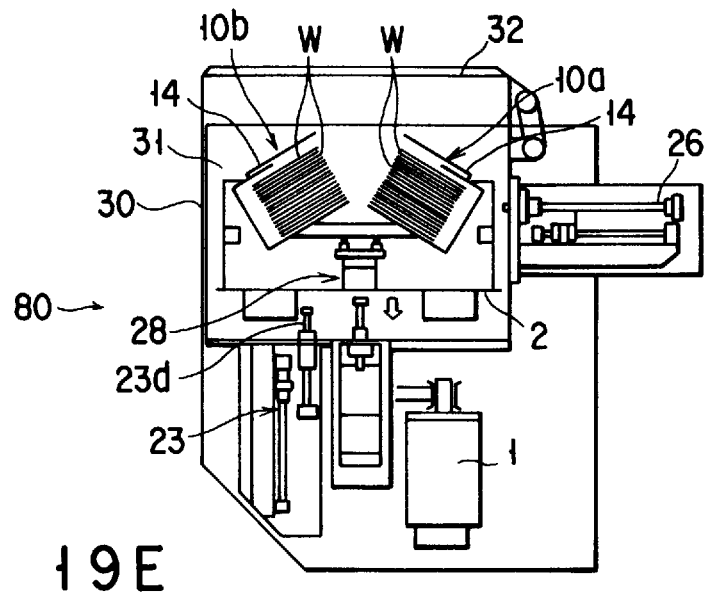
F I G. 19E
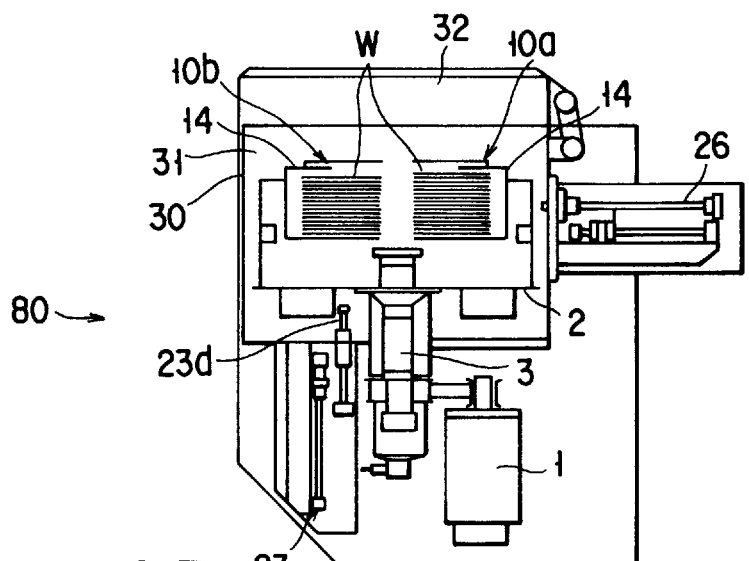
F I G. 19F

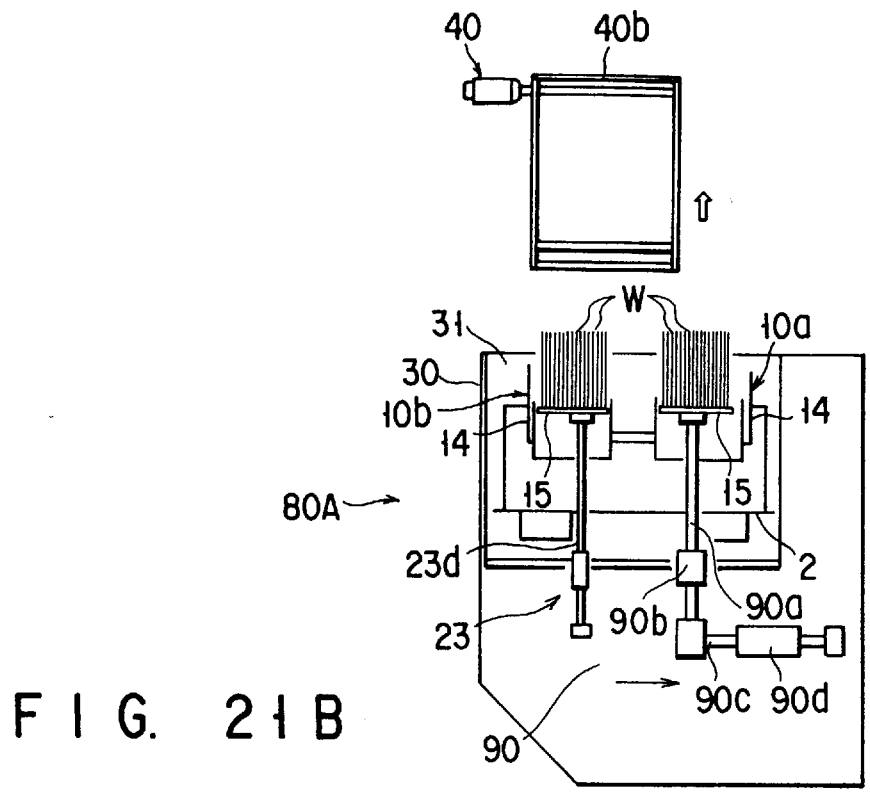
F I G. 21B
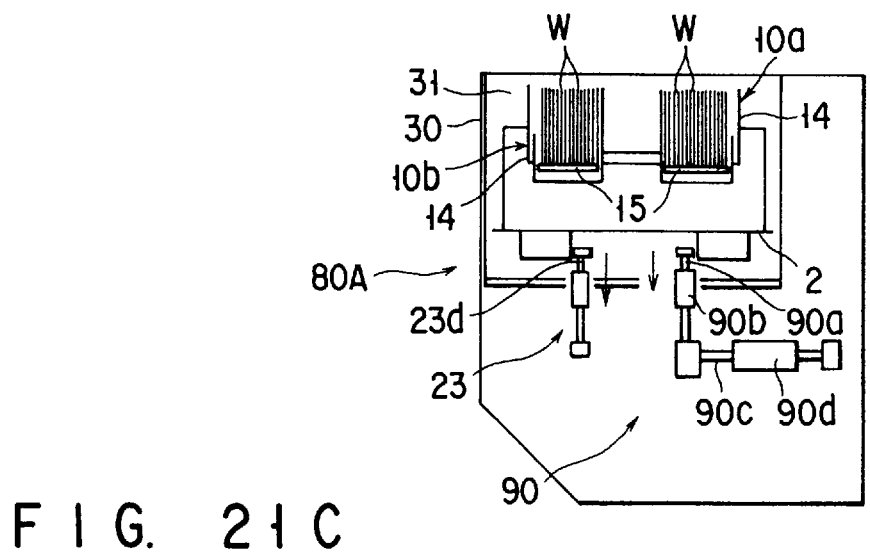
F I G. 21C

SPIN DRYER AND SUBSTRATE DRYING METHOD

BACKGROUND OF THE INVENTION

The present invention relates to a spin dryer for centrifugally removing a liquid material from a substrate such as a semiconductor wafer or a glass substrate for LCD (liquid crystal display device) so as to dry the substrate surface and also relates to a substrate drying method.

In the manufacture of a semiconductor device, a semiconductor wafer is subjected to washing with chemicals and water, followed by drying the wafer so as to cleanse the wafer surface. Used in the drying step is a spin dryer disclosed in, for example, U.S. Pat. No. 5,435,075, Japanese Utility Model Disclosure (Kokai) No. 63-180925, Japanese Patent Disclosure No. 7-17651, and Japanese Patent Disclosure No. 6-97148.

When it comes to the spin dryer disclosed in U.S. Pat. No. 5,435,075, it is necessary to introduce a drying air effectively into the cradle and to distribute efficiently the introduced drying air into spaces between adjacent wafers in order to bring the drying air into contact sufficiently and uniformly with each wafer. Also, dusts generated from a driving source of the cradle and the peripheral equipment and particles generated by static charging are likely to be contained in the drying air, with the result that these particles are attached to the wafer in the drying step so as to bring about a wafer contamination problem. Further, it is possible for the air discharged through an outlet port of the drying chamber to flow backward into the drying chamber, with the result that the particles contained in the discharged air are likely to be attached to the wafer.

In the spin dryer disclosed in Japanese Utility Model Disclosure No. 63-180925, a pair of box-shaped cassette holders are rockably supported by a pair of frame walls erected on a rotor. The spin dryer is constructed to permit these cassette holders to be moved away from or toward each other. In this apparatus, cassettes each housing a large number of wafers are inserted into the paired cassette holders, followed allowing these cassette holders to be moved away from each other. Then, when the rotor is rotated under this condition, the cassette holders assume a horizontal posture so as to permit the liquid material attached to the wafer to be centrifugally removed from the wafer surface. In this apparatus, however, the wafers after the washing treatment are inserted together with the cassette into cassette holder. Naturally, the cassette holder occupies a larger volume, leading to enlargement of the drying apparatus. In addition, the cassette is also dried together with the wafers, leading to a longer time required for the drying operation. Further, since the cassette is inserted into the cassette holder, the flow of the drying air is disturbed, leading to a lower drying efficiency. Still further, the disturbance of the drying air flow causes the particles to be more likely to be attached to the wafers, leading to the wafer contamination problem.

The apparatus disclosed in Japanese Patent Disclosure No. 7-176512 comprises a mount (cassette) for holding wafers transferred by a transfer arm and a box-shaped cradle for housing the mount (cassette). The cradle is equipped with a holding member for holding the mount in a lower position of the wafers and with another holding member for holding the mount in the central position of the wafers. Since the mount in place of a cassette is put in the box-shaped cradle, the volume occupied by the cradle is diminished, leading to miniaturization of the drying apparatus. However, since the cradle is in the shape of a box, a drying air flowing within the cradle is disturbed, leading to a low drying efficiency. In addition, the disturbance of the drying air flow causes particles to be attached to the wafer, leading to a wafer contamination problem.

Further, the apparatus disclosed in Japanese Patent Disclosure No. 6-97148 comprises a pair of inclinable cradles positioned to face each other and a horizontal holding mechanism for horizontally holding these cradles. Also, holding mechanisms for holding the peripheral portions of the wafer are mounted to the side walls of each of these cradles so as to prevent the wafers from being dropped during rotation of the cradle. However, the wafer holding mechanism included in the apparatus disclosed in this prior art is considerably complex in construction. Also, since a spring force is utilized for holding the wafer, the contact area between the holding member and the wafer is increased. It follows that a foreign matter is likely to be attached to the wafer, giving rise to contamination of the wafer. Further, where the pushing force of the spring is excessively large, the wafer is likely to be deformed.

What should also be noted is that, in the conventional spin dryer, it is necessary to lessen the impact received by the wafer during rotation of the cradle at a high speed so as to prevent the damage done to the wafer.

BRIEF SUMMARY OF THE INVENTION

An object of the present invention is to provide a spin dryer and a substrate drying method, which permit effectively utilizing a drying air, permit diminishing the contact area between the substrate to be dried and the holding member as much as possible, permit preventing particles from being attached to the substrate, permit improving the yield and throughput, and also permit miniaturization of the drying apparatus.

According to a first aspect of the present invention, which is intended to achieve the above-noted object, there is provided a spin dryer for centrifugally removing water droplets attached to a plurality of substrates, comprising a rotor having a main shaft formed in a lower portion; substrate holding means for holding a plurality of substrates such that main surfaces of the substrates are perpendicular to the main shaft of the rotor, the holding means being positioned in symmetry with respect to the main shaft of the rotor and rotated together with the rotor; a treating vessel surrounding the rotor and the substrate holding means; an air inlet port formed in an upper portion of the treating vessel for introducing air into the treating vessel; and an exhaust port formed in a side portion of the treating vessel in a manner to extend upward from the bottom portion of the treating vessel to reach at least the height position of the rotor.

It is possible to connect an exhaust duct to the exhaust port and to arrange within the exhaust duct a separating means for separating the liquid material from the exhaust air flowing through the duct. It is also possible to arrange a ceiling plate in the air inlet port of the process container, the ceiling plate being provided with an air-flowing hole in the center. In this case, an annular filter may be arranged above the ceiling plate. Also arranged is a shielding guide plate having an inclined portion extending from above the filter toward the central portion of the filter. Further, a static charge removing means (ionizer) may be mounted in the air inlet port. Still further, it is desirable for the bottom of the treating vessel to be gradually inclined downward in the rotating direction of the rotor and toward the exhaust port formed in a side portion of the treating vessel.

According to a second aspect of the present invention, there is provided a spin dryer for centrifugally removing water droplets attached to a plurality of substrates, comprising a rotor having a main shaft formed in a lower portion; rotating means for rotating the rotor; a chamber having the rotating means housed therein; at least a pair of substrate holding means for holding a plurality of substrates such that main surfaces of the substrates are perpendicular to the main shaft of the rotor, the holding means being positioned in symmetry with respect to the main shaft of the rotor and rotated together with the rotor; a treating vessel surrounding the rotor and the substrate holding means; an air inlet port formed in an upper portion of the treating vessel for introducing air into the treating vessel; an exhaust port formed in a side portion of the treating vessel in a manner to extend upward from the bottom portion of the treating vessel to reach at least the height position of the rotor; an exhaust duct communicating with the exhaust port; a shaft exhaust pipe communicating with a clearance between the main shaft of the rotor and a seal cover rotatably supporting the main shaft; and a chamber exhaust pipe communicating with at least a chamber housing the rotating means, the open end portion of the shaft exhaust pipe being inserted into the chamber exhaust pipe such that the exhaust air stream within the shaft exhaust pipe is combined with the exhaust air stream within the chamber exhaust pipe.

According to a third aspect of the present invention, there is provided a spin dryer for centrifugally removing water droplets attached to a plurality of substrates, comprising a rotor rotated by rotating means; at least a pair of substrate holding means for holding a plurality of substrates, the substrate holding means being arranged in symmetry with respect to a shaft of the rotor; and a hood mounted to the rotor and having a pair of side walls linearly covering the side portions of the substrate holding means, wherein the substrate holding means comprises a side wall portion parallel with the side walls of the hood; and an air passageway open in a radial direction of the rotor.

According to a fourth aspect of the present invention, there is provided a spin dryer for centrifugally removing water droplets attached to a plurality of substrates, comprising a rotor rotated by rotating means; at least a pair of substrate holding means for holding a plurality of substrates, the substrate holding means being arranged in symmetry with respect to a shaft of the rotor; a treating vessel surrounding the rotor and the supporting means; and a hood mounted to the rotor and having a pair of side walls linearly covering the side portions of the substrate holding means, wherein, the substrate holding means comprises a side wall portion parallel with the side walls of the hood, and an air passageway open in a radial direction of the rotor; and the treating vessel comprises an air inlet port formed in a portion facing the center of rotation of the rotor and an exhaust port formed in a side portion of the treating vessel in a manner to extend upward from the bottom portion of the treating vessel to reach at least the height position of the rotor.

According to a fifth aspect of the present invention, there is provided a spin dryer for centrifugally removing water droplets attached to a plurality of substrates, comprising a rotor rotated by rotating means; at least a pair of substrate holding means arranged in symmetry with respect to a shaft of the rotor; relative moving means for relatively moving the substrate holding means; inclining means for inclining each of the substrate holding means; a lower supporting body mounted to the substrate holding means and provided with a plurality of grooves for holding a lower portion of each of the substrates; a supporting frame provided with a plurality of grooves for holding peripheral side portions of the substrate; and lift means for moving upward the lower supporting body relative to the supporting frame.

According to a sixth aspect of the present invention, there is provided a spin dryer for centrifugally removing water droplets attached to a plurality of substrates, comprising a rotor rotated within a horizontal plane by rotating means; at least a pair of supporting means for supporting a plurality of substrates, the supporting means being capable of inclination and arranged in symmetry with respect to a shaft of the rotor; a treating chamber having an upper opening and housing the rotor and the supporting means; a lid positioned to close the upper opening of the treating chamber; moving means for moving the supporting means; and opening/closing means for opening/closing the lid, wherein, when the supporting means is moved by the moving means, the lid is opened/or closed by the opening/closing means.

Further, according to a seventh aspect of the present invention, there is provided a method of drying a plurality of substrates by centrifugally removing water droplets attached to the substrates, comprising the steps of:

(a) collectively receiving in a treating chamber a plurality of cassettes each housing a plurality of substrates equidistantly arranged to stand upright to assume a vertical posture;

(b) classifying the received substrates into at least two groups;

(c) changing the posture assumed by the substrates of each group from the vertical posture to a horizontal posture;

(d) starting rotation of the substrates of all the groups at a first angular acceleration; and (e) continuing to rotate the substrates of all the groups at a second angular acceleration higher than the first angular acceleration until the angular speed of the substrate reaches a predetermined maximum angular speed.

In the present invention, the drying air introduced into the treating vessel through an air inlet port formed in an upper portion of the treating vessel is brought into contact with the substrates so as to permit the water droplets attached to the substrates to be scattered to the outside. Then, the waste drying air is discharged to the outside of the treating vessel through an exhaust port open in a side portion of the supporting means.

Also, a gas-liquid separation means is arranged within an exhaust duct communicating with the exhaust port so as to separate the liquid component (mist) from the exhaust gas after the drying step. In addition, it is possible to suppress damages done to the substrate by the back stream of the waste drying air flowing from the exhaust side.

Also, the drying air can be introduced from the outer circumferential region to form a down-stream flowing toward the central region of the spin dryer. Then, the air stream flows from the central region of the rotor toward the outer circumferential region so as to be brought into contact uniformly with the substrates held by the support means rotated below the substrates.

Also, a static charge removing means (ionizer) is arranged in the air inlet port so as to neutralize the ionized particles within the drying air. As a result, the particles in the drying air are prevented from being attached electrostatically to the substrates.

Also, the bottom of the treating vessel is gradually inclined downward in the rotating direction of the rotor and from the central region toward the exhaust port formed in the outer peripheral region. As a result, the liquid droplets centrifugally separated from the substrates are positively collected in the outer circumferential region of the bottom of the treating vessel and discharged rapidly to the outside through the exhaust port.

Further, particles within the shaft of the rotor are prevented from entering the rotor, and the volume of the exhaust system can be decreased so as to miniaturize the apparatus. Still further, the waste drying air within the treating chamber can be discharged to the outside without fail and can be prevented from flowing backward into the treating chamber. It should be noted in this connection that it is desirable to bend the end portion of the shaft exhaust pipe within the chamber exhaust pipe such that the exhaust gas discharged from the shaft exhaust pipe flows in the same direction as the flowing direction of the exhaust gas within the chamber exhaust pipe. Where the end portion of the shaft exhaust pipe is bent in this particular direction, the exhaust gas discharged from the shaft exhaust pipe permits facilitating the flow of the exhaust gas within the chamber exhaust pipe. It follows that the back flow of the exhaust gas into the treating chamber can be prevented more effectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a perspective front view schematically showing a spin dryer according to a first embodiment of the present invention;

FIG. 5 is a cross sectional view showing a gist portion of the spin dryer shown in FIG. 2;

FIG. 10 is a plan view showing the cradle and its peripheral members included in the spin dryer shown in FIG. 2;

FIG. 13 is a cross sectional view partly showing the holding means for describing how the wafer is transferred and held by the holding means;

FIG. 14 schematically shows the wafer held by the holding means (wafer holding portion);

FIG. 15A is a cross sectional view showing the wafer holding portion cut along line XVA—XVA shown in FIG. 14;

FIG. 15B is a cross sectional view showing the wafer holding portion cut along line XVB—XVB shown in FIG. 14;

FIG. 15C is a cross sectional view showing the wafer holding portion cut along line XVC—XVC shown in FIG. 14;

FIG. 17 is a cross sectional view showing the holding means assuming a horizontal posture;

FIG. 18 is a cross sectional view showing a gist portion of a spin dryer;

FIGS. 19A to 19J are cross sectional views collectively showing the postures assumed by a spin dryer for the drying of substrates;

FIGS. 21A to 21C are cross sectional views collectively showing how a spin dryer according to another embodiment of the present invention is operated for the drying of substrates.

DETAILED DESCRIPTION OF THE INVENTION

Let us describe various preferred embodiments of the present invention with reference to the accompanying drawings. The following description covers cases where semiconductor wafers are subjected to drying treatments.

Figure 1:
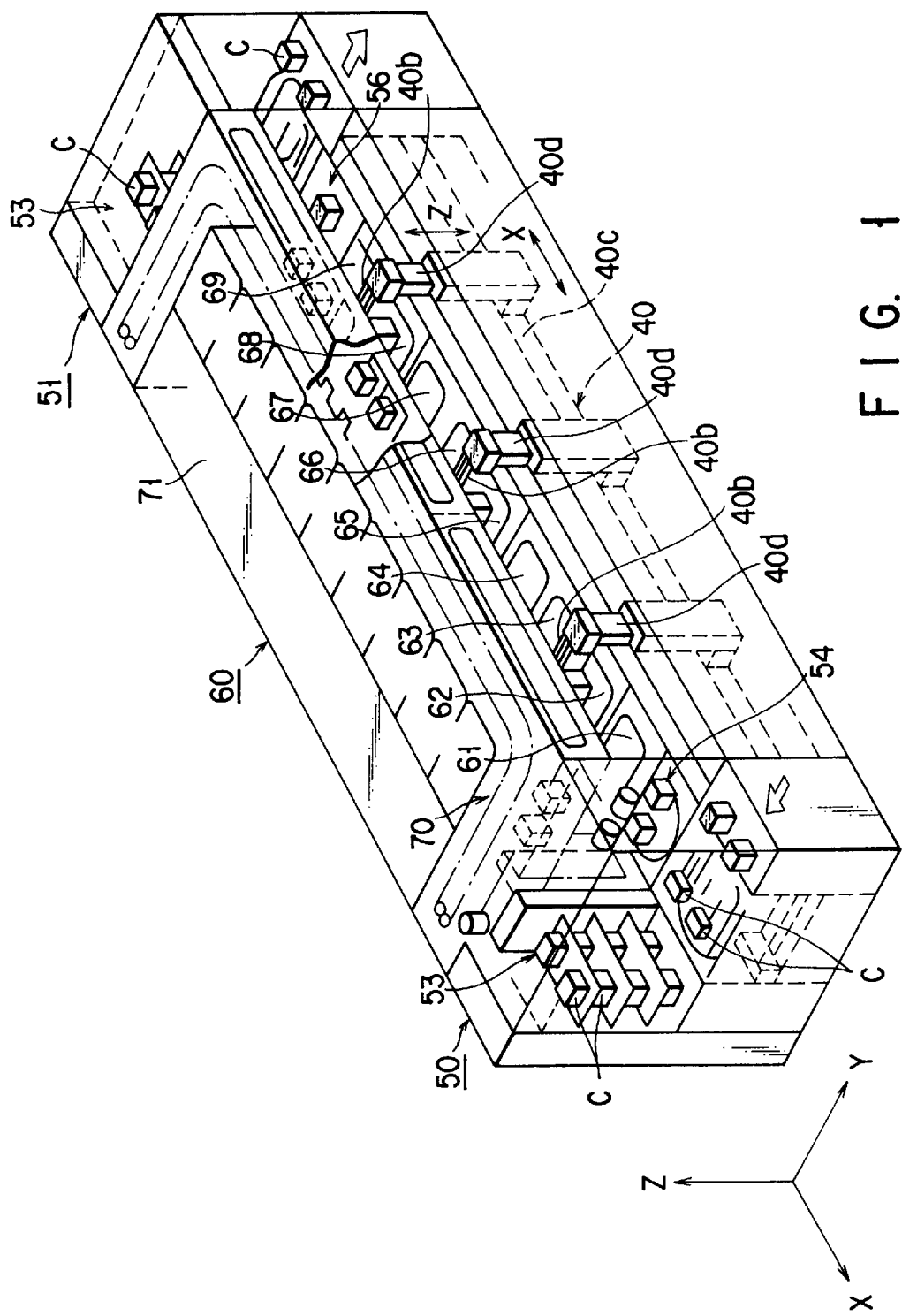
FIG. 1 is an oblique view schematically showing the entire construction of a substrate washing-drying system.

FIG. 1 shows a wafer washing/drying system. As shown in the drawing, the system comprises a process section 60, an input buffer section 50, and an output buffer section 51. A cassette C housing untreated wafers W is inserted into the input buffer section 50, which is arranged on the side of a loader section 54 included in the process section 60. On the other hand, the cassette C housing treated wafers W is transferred into the output buffer section 51, which is arranged on the side of an unloader section 56 included in the process section 60. Each of the input buffer section 50 and the output buffer section 51 comprises a waiting section 53. Two cassettes C are transferred at a time by a cassette transfer device (not shown) from the waiting section 53 into the loader section 54.

The process section 60 comprises three wafer transfer devices 40, nine treating units 61 to 69, a cassette transfer section 70, and a tank/piping housing chamber 71. A wafer chuck 40*b* of a wafer transfer device 40 is washed and dried in the first treating unit 61. The wafer W is subjected to a chemical washing with a first chemical solution in the second treating unit 62, to a water wash in each of the third and fourth treating units 63, 64, to a chemical washing with a second chemical solution in the fifth treating unit 65 and, then, to a water wash in each of the sixth and seventh treating units 66, 67. Further, the chuck 40b of the wafer transfer device 40 is washed and dried in the eighth treating unit 68. Still further, the wafer W is subjected to a final drying treatment in the ninth treating unit 69. Naturally, a spin dryer 80 of the present invention is arranged within the ninth treating unit 69.

As shown in FIG. 2, the spin dryer 80 comprises a servo motor 1, a rotor 2, a pair of cradles 10a, 10b, a treating vessel 30, and an upper lid 32. The cradles 10a, 10b, which are mounted on the rotor 2, are housed in the treating vessel 30 together with the rotor 2. An air inlet port 30a is open in an upper portion of the treating vessel 30 which has a bottom and is cylindrical. The wafer W is transferred into and out of the treating vessel 30 by the wafer transfer device 40 through the air inlet port 30a. The upper lid 32 is movably supported above the treating vessel 30 by hinge mechanisms 37, 37a, 38 such that the air inlet port 30a is opened or closed by the movement of the upper lid 32.

The wafer transfer device 40, which is movable in any of x-, y- and z-axis directions, is arranged outside the spin dryer 80. The wafer chuck 40b of the wafer transfer device 40 is capable of holding 50 wafers at a time so as to transfer these wafers into the spin dryer 80.

Figure 4:
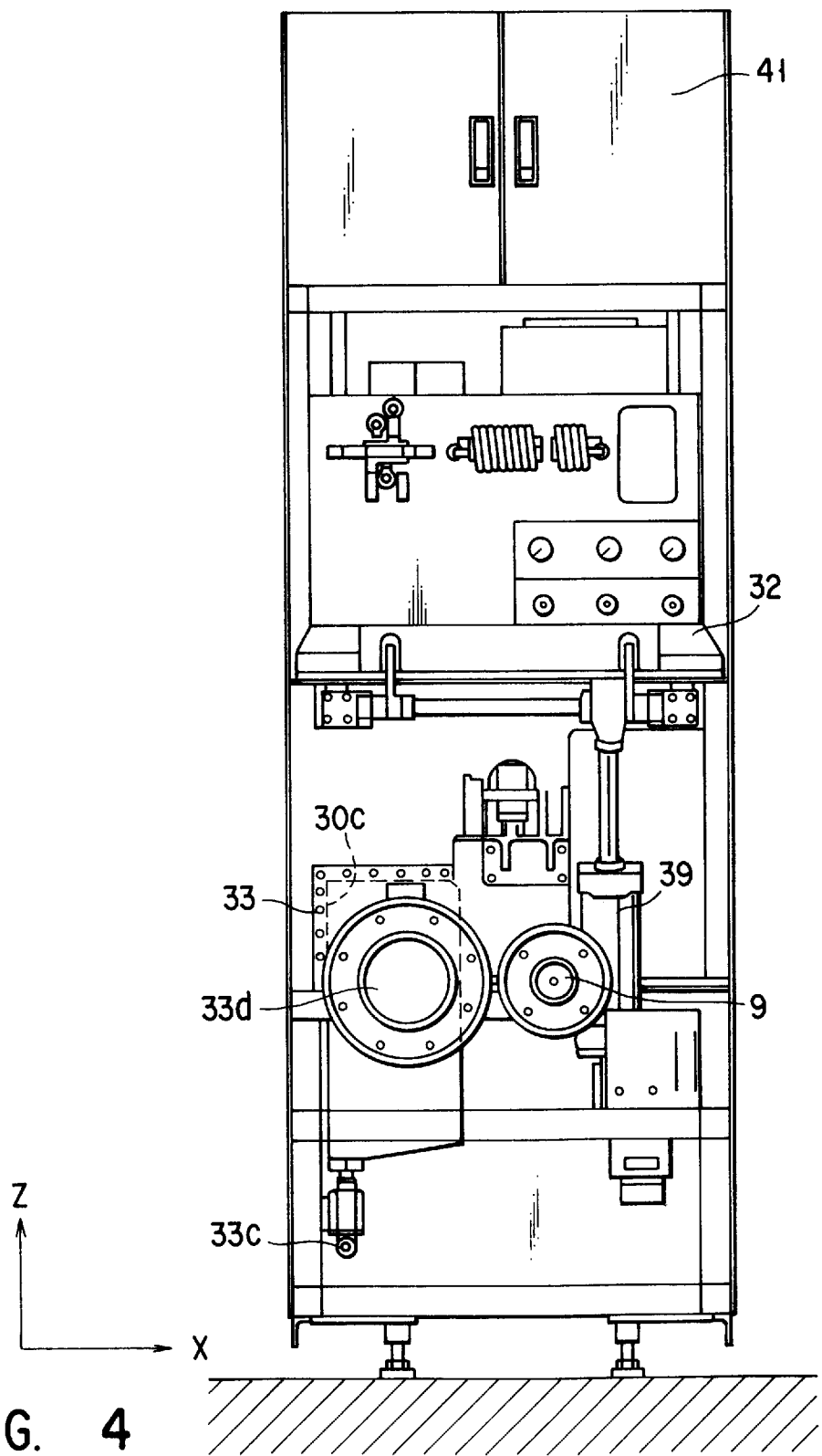
FIG. 4 is a side view showing the outer appearance of the spin dryer shown in FIG. 2.

As shown in FIGS. 2 and 4, a controller box 41 is arranged obliquely upward of the spin dryer 80. The controller box 41, which is connected to a power source (not shown), serves to supply electric power to the servo motor 1, a lift means 23, a openable cylinder 39, etc. A controller (not shown), which is backed up by a process computer, is housed in the controller box 41, with the result that the operations of the servo motor 1, the lift means 23, the openable cylinder 39, etc. can be controlled by the controller box 41. Further, a plurality of nozzles 43 are arranged in the central and inner circumferential regions of the air inlet port 30a. A washing liquid such as pure water is spurted from these nozzles 43 into the treating vessel 30.

A Fan-Filter Unit (FFU) 44 including a filter (not shown) and a fan (not shown) is arranged above the spin dryer 80 so as to cleanse the air supplied into the spin dryer 80. The operation of the fan included in the FFU 44 is controlled by a controller housed in the box 41 so as to variably control the air flow rate into the spin dryer 80.

In order to stabilize the drying operation, the flow speed and rate of the clean air within the ninth treating unit 69 are controlled at predetermined values by the controller within the box 41. To be more specific, measured are the air flow speeds and rates along both inner and outer circumferential surfaces of the treating vessel 30, covering the cases where the rotor 2 is rotated at various angular speeds. The measured data are stored in advance in a memory of the process computer. On the other hand, the angular speed of the rotor 2 during the actual drying treatment is detected by an encoder (not shown). Naturally, the operation of the fan included in the unit 44 is controlled by the controller on the basis of the detected angular speed and the data stored in the memory. As a result, the flow speed and rate of the clean air are maintained to fall within predetermined ranges within the spin dryer 80. Incidentally, it is possible to mount an air flow speed/rate sensor (not shown) in the vicinity of the outer surface of an upper filter 35 so as to keep the flow speed and rate of the clean air controlled within the spin dryer 80 on the basis of the detected data generated from the sensor.

Figure 3:
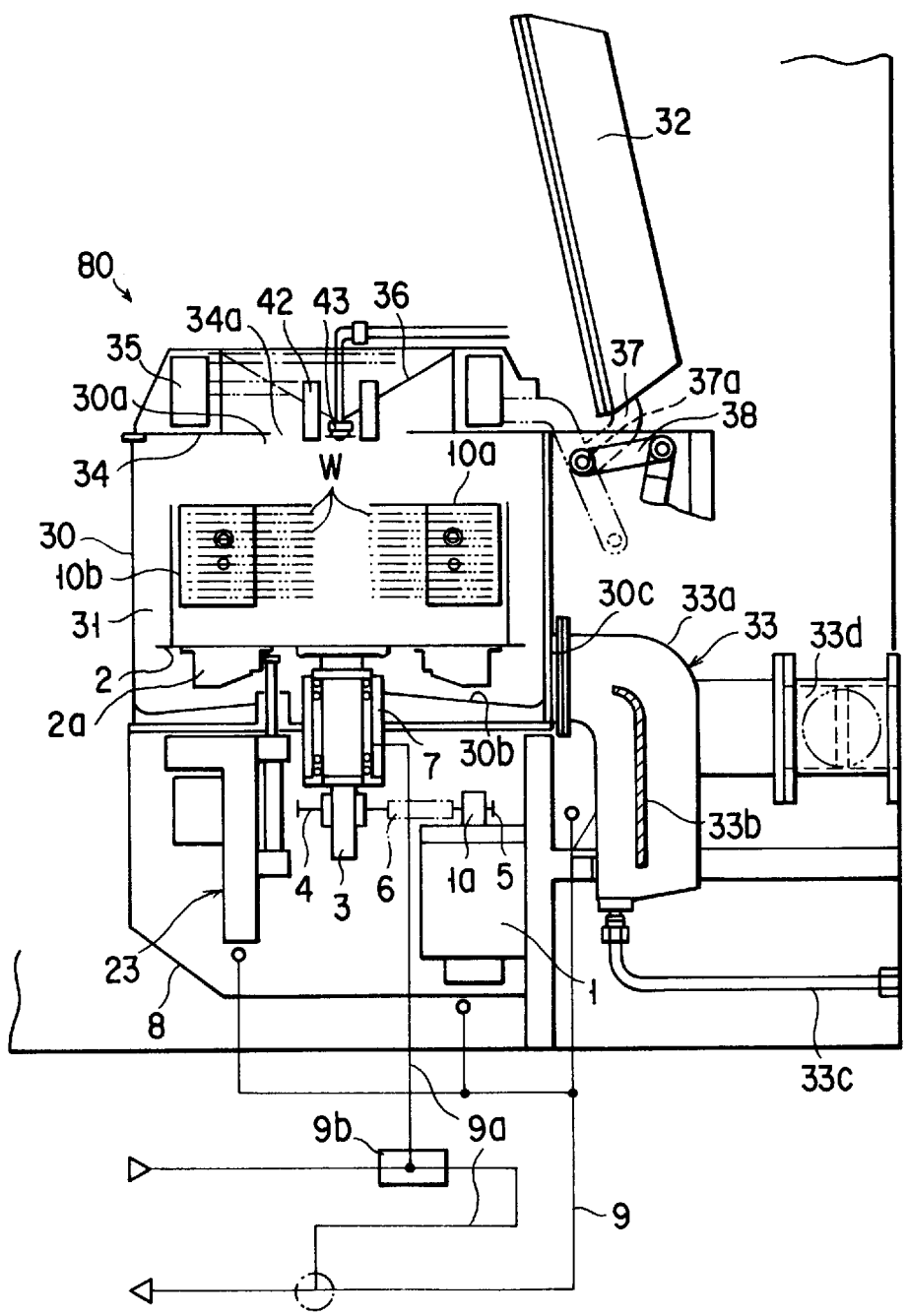
FIG. 3 is a perspective front view schematically showing in a magnified fashion a part of the spin dryer shown in FIG. 2.

As shown in FIGS. 3 and 5, an automatic balancer 2a for preventing vibration is mounted to the lower periphery of the rotor 2. A main shaft 3 is attached to a lower central portion of the rotor 2. A driving pulley 4 is attached to one end of the main shaft 3. Also, a timing belt 6 is stretched between the driving shaft of the servo motor 1 and the pulley 4, with the result that the driving force of the motor 1 is transmitted to the main shaft 3. It should be noted that the starting, stopping, braking and horizontal rotation at a very low speed of the rotor 2 and the cradles 10a, 10b can be performed continuously by controlling the driving of the servo motor 1.

As shown in FIG. 5, the interface between the bottom portion of the treating vessel 30 and the main shaft 3 of the rotor 2 is maintained impermeable to both gaseous and liquid materials by a sealed bearing mechanism comprising a seal cover 7, a ball bearing 7a and a sealing cylindrical body 7b. The sealing cylindrical body 7b is mounted to the bottom portion of the treating vessel 30. As shown in the drawing, the main shaft 3 is rotatably supported by the sealing cylindrical body 7b via the ball bearing 7a.

The cradles 10a, 10b are arranged in symmetry with respect to the axis of the rotor 2. To allow 25 wafers W to be held, 25 grooves are formed in each of these cradles 10a, 10b. In the embodiment shown in the drawings, a pair of cradles 10a, 10b are arranged within the spin dryer 80. However, it is also possible to arrange a plurality of pairs of cradles within the spin dryer. It is also possible to provide a single cradle within the spin dryer.

Figure 6:
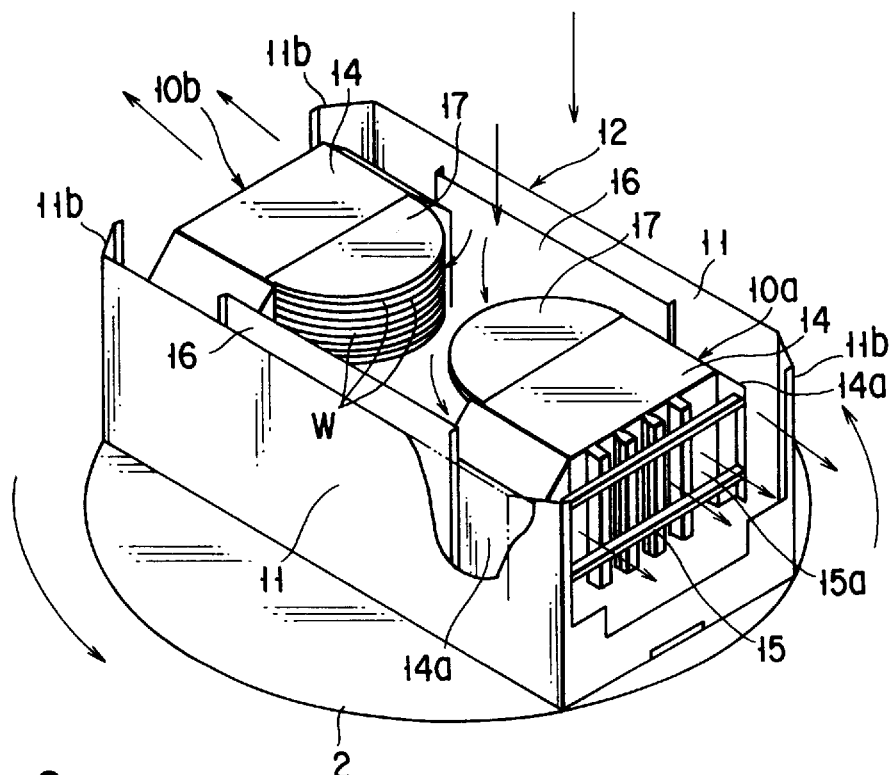
FIG. 6 is an oblique view showing a rotor, a holding means and a cradle included in the spin dryer shown in FIG. 2.

As shown in FIG. 6, a hood 12 is mounted on the rotor 2. The hood 12 comprises a pair of vertical side walls 11, which extend parallel to each other, and is open in the upper and two side portions. The cradles 10a, 10b are located between these two side walls 11. Since the side walls 11 are sufficiently higher than the cradles 10a, 10b, both sides of the cradles 10a, 10b are protected by the vertical side walls 11.

Each of the cradles 10a, 10b comprises a cylindrical supporting frame 14 having a rectangular cross section and a lattice-shaped lower supporting body 15. The supporting frame 14 comprises a wall portion 14a parallel with the vertical side wall 11. The lower supporting body 15 is movable in a vertical direction relative to the supporting frame 14. The edge portions of the supporting frame 14 and lattice holes 15a of the lower supporting body 15 act as air passageways of the cradles 10a, 10b. These air passageways are open in a radial direction of the rotor 2. It follows that the liquid droplets centrifugally separated from the wafers W are discharged to the outside through only the air passageways on the side of the lattice holes 15a.

Figure 7:
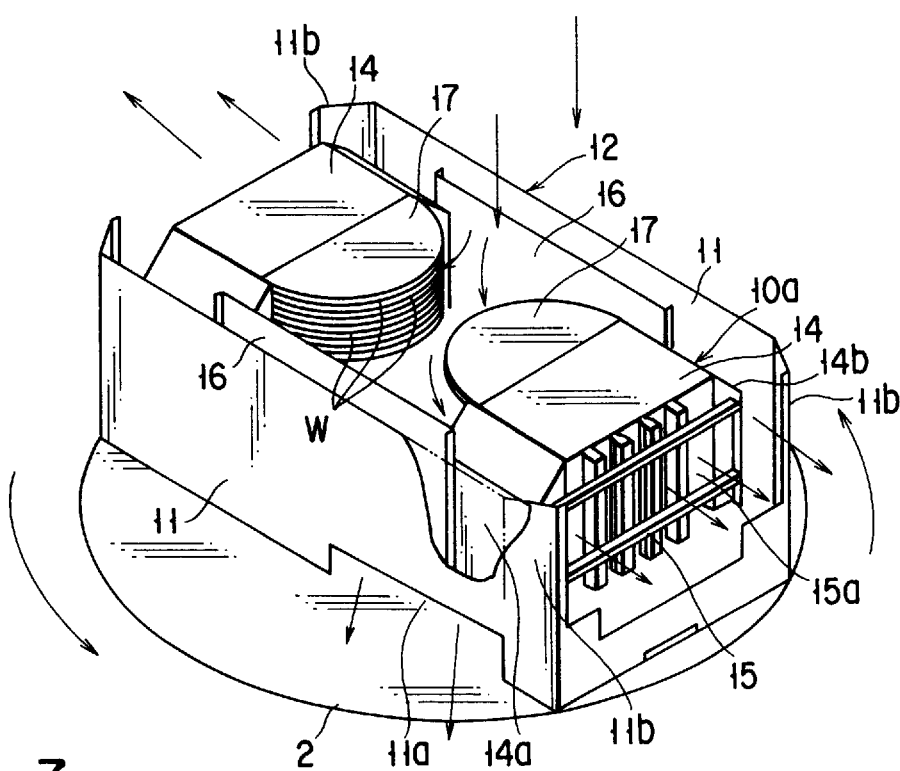
FIG. 7 is an oblique view showing another rotor, another holding means and another cradle included in the spin dryer shown in FIG. 2.

Incidentally, it is possible to form a water discharge hole 11a in the side wall 11, as shown in FIG. 7. The hole 11a should be formed on the rear side in respect of to the rotating direction of the hood 12 and should be positioned closer to the end of the side wall 11. Also, the hole 11a should desirably be positioned in a lower portion of the side wall 11. In this case, the liquid droplets centrifugally separated from the wafers W can be discharged to the outside through the water discharge hole 11a as well as through the lattice holes 15a, leading to a further improvement in the drying efficiency.

Figure 19A:
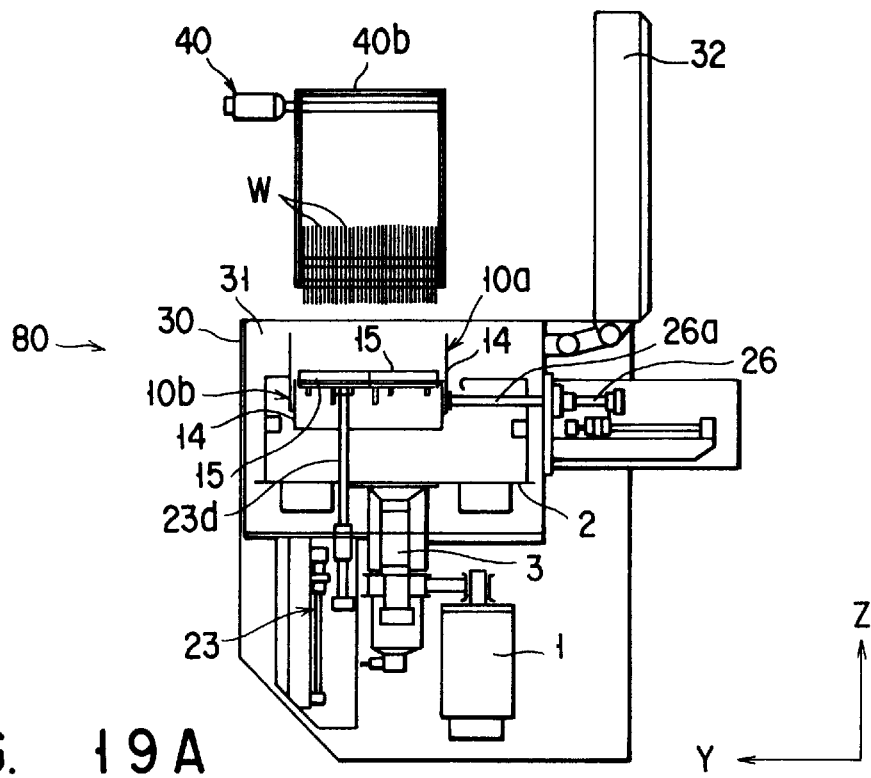

As shown in FIG. 10, the supporting frame 14 is mounted to the hood 12 such that the frame 14 is swingable about a pair of horizontal pivots 13 so as to assume variable postures. When the wafers W are transferred from the chuck 40b to the supporting frame 14, the supporting frame 14 assumes an upright posture, as shown in FIGS. 19A to 19D. In this stage, the wafers W transferred to the supporting frame 14 also assume an upright posture. When the wafers W are rotated at a high speed, the supporting frame 14 is allowed to assume a lying posture, as shown in FIG. 19F. Naturally, the wafers W also assume a lying posture in this stage.

As shown in FIGS. 6 and 7, an air flow regulating plate 16 is mounted between the side wall 11 of the hood 12 and the cradles 10a, 10b. Since the plate 16 permits the air to flow through the clearance between the side wall 11 and the cradles 10a, 10b, the air stream is regulated. The plate 16 also serves to prevent the particles brought from outside into the hood 12 from entering the cradles 10a, 10b having the wafers W arranged therein.

An inclined portion 14b is formed in the outermost circumferential region of each of the cradles 10a, 10b, i.e., in the outer edge portion of the supporting frame 14 assuming a horizontal posture. Also, an inclined portion 11b is formed in the side edge portion of the side wall 11 in a manner to extend in the rotating direction of the side wall 11. These inclined portions 14b, 11b permit effectively releasing to the outside the water droplets attached to the cradles 10a, 10b and the side wall 11. Further, the inclined portions 11b formed at both end portions of the side wall 11 serve to impart rigidity to the hood 12. Incidentally, arcuate portions may be formed in place of the inclined portions 14b, 11b.

A dummy plate 17 is mounted to each of the cradles 10a, 10b such that, when the wafers W held by these cradles are positioned to assume a horizontal posture, the dummy plate 17 is positioned at the upper end of each these cradles 10a, 10b. The dummy plate 17, which is shaped semi-circular and is substantially equal in shape to the wafer W, extends toward the center of the hood 12. As apparent from the drawing, the dummy plate 17 is positioned to cover substantially a half region of the wafer W held by each of the cradles 10a, 10b. It should be noted that the air stream flowing along the wafer W at the upper end of the wafers W held by each of the cradles 10a, 10b is regulated by the dummy plate 17 so as to prevent the wafer W at the upper end from incurring damages done by a turbulent air stream.

As described above, the hood 12 mounted to the rotor 2 is open at two side ends and at the upper end. Because of the particular construction the ambient air is taken inside the hood 12 by the side wall 11 which is kept rotated. At the same time, the air introduced from above is distributed from the central portion of the rotor 2 into the clearances among the side walls 11, air flow regulating plates 16, and side walls 14a of the cradles 10a, 10b and into the clearances between adjacent wafers W. It follows that the water droplets attached to the wafers W are centrifugally discharged to the outside with a high efficiency.

Figure 8:
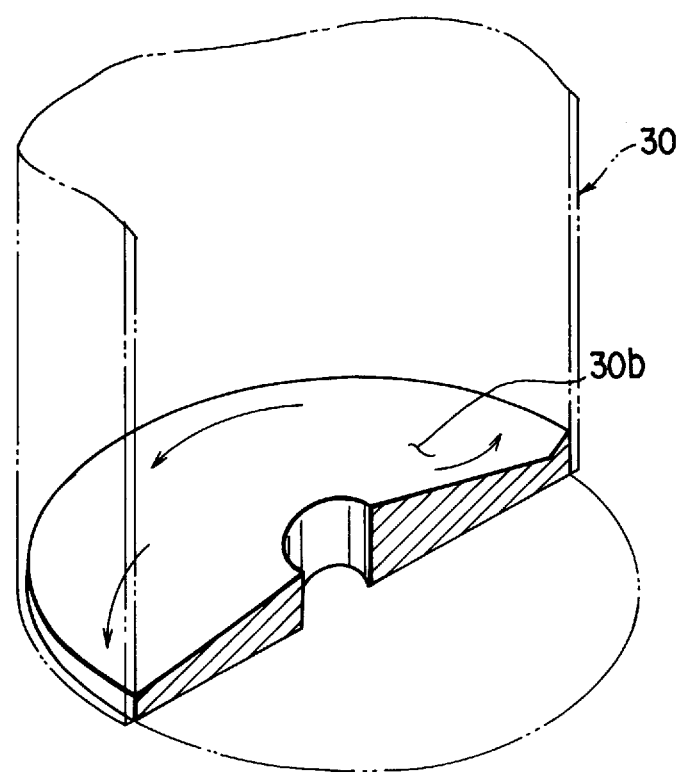
FIG. 8 is an oblique view, partly broken away, showing the bottom portion of the treating vessel included in the spin dryer of the present invention.

As shown in FIGS. 3 and 8, the bottom portion 30b of the treating vessel 30 is inclined downward in the radial direction toward the lower end of an outlet port 30c. The inclination permits the water droplets centrifugally separated from the wafers W to be released promptly from within the treating vessel 30.

FIGS. 10 to 18 collectively show the constructions and functions of the supporting frame 14 and the cradles 10a, 10b. In this embodiment, two supporting frames 14 of substantially the same construction are arranged in symmetry in respect of the cradles mounted therein. Therefore, the following description covers only one of these two supporting frames 14.

The supporting frame 14 comprises the lower supporting body 15 referred to previously, a pair of holding portions 18, two first holding rods 19, two second holding rods 20, a supporting base portion 21, and a pair of guide shafts 22. The holding portions 18 are formed along the upper portions of the inner walls of the supporting frame 14 such that these holding portions 18 are allowed to face each other. Equidistantly formed on each of the mutually facing surfaces of these holding portions 18 are 25 grooves 18a. Peripheral portions at the largest diameter portion of wafer W are inserted into the mutually facing grooves 18a, with the result that the wafers W are held stable within the supporting frame 14.

The lower supporting body 15 comprises a pair of first holding rods 19, a pair of second holding rods 20 and a supporting base portion 21. The paired first holding rods 19 serve to hold the wafer W at two points somewhat away from the lowest position of the wafer W. Also, the paired second holding rods 20 serve to hold the wafer W at two points outside the holding points of the first rods 19. Formed in each of the paired first holding rods 19 are 25 grooves 19a. Likewise, 25 grooves 20a are formed in each of the paired second holding rods 20.

Each of the holding portions 18, first holding rods 19 and second holding rods 20 is made of a material having a high resistance to chemicals and a high mechanical strength, including, for example, PTFE (polytetrafluoroethylene), PFA (tetrafluoroethylene-perfluoroalkylvinylether copolymer), quartz or PEEK (polyether-ether-ketone). On the other hand, each of the supporting frame 14 and the supporting base portion 21 is made of an aluminum alloy and has the surface treated with tuframe process and impregnated with a fluoroplastic material. Since each of the supporting frame 14 and the supporting base portion 21 is made of an aluminum alloy having the surface impregnated with a fluoroplastic material, the lower supporting body 15 is light in weight and exhibits a long life. Incidentally, it is possible for at least the supporting base portion 21 alone to be formed of an aluminum alloy having the surface impregnated with a fluoroplastic material. Where the supporting base portion 21 alone is formed of an aluminum alloy having the surface treated with tuframe process, it is possible to use an electrolytically polished stainless steel for forming the supporting frame 14.

As already described, the wafer W is supported at 4 points by the paired first holding rods 19 and the paired second holding rods 20, with the result that the lower portion of the wafer W is held stable. Also, the water droplets falling down naturally from the lowest end portion of the wafer W are not obstructed by the holding rods 19, 20, leading to a satisfactory release of the water droplets to the outside.

As shown in FIG. 15A, the groove 19a formed in the first holding rod 19 has a substantially V-shaped cross section. On the other hand, the groove 20a formed in the second holding rod 20 comprises a V-shaped groove portion 20b and a widened groove portion 20c, as shown in FIG. 15B. Further, the groove 18a formed in the holding portion 18 comprises a groove base portion 18b somewhat broader than the thickness of the wafer W and a widened groove portion 18c contiguous to the base portion 18b and substantially V-shaped in its cross section, as shown in FIG. 15C.

The lower end portion of the wafer W can be held by the first holding rod 19 because the groove 19a formed in the rod 19 has a V-shaped cross section. Also, the wafer W is held by the V-shaped groove portion 20b of the groove 20a formed in the second holding rod 20 at a portion somewhat higher than the portion held by the first rod 19. At the same time, the lateral movement of the wafer W is regulated by the widened groove portion 20c of the groove 20a. Further, since the groove 18a formed in the holding portion 18 has a substantially V-shaped cross section, the side portions in the central portion of the wafer W can be held by the groove 18a while regulating the lateral movement of the wafer W. It follows that the wafer W can be held stable while markedly diminishing the contact area between the holding mechanism and the wafer W, said holding mechanism including the holding rods 19, 20 and the holding portion 18.

As shown in FIG. 10, the lower supporting body 15 is slidably mounted to guide shafts 22 arranged on both sides of the supporting frame 14. Also, the lower supporting body 15 can be moved vertically (Z-axis direction shown in FIG. 2) by the lift means 23 positioned below the treating vessel 30. It follows that the wafers W can be transferred between the wafer transfer device 40 and the lower supporting body 15 by vertically moving the lower supporting body 15 relative to the supporting frame 14. What should also be noted is that, even if the lower supporting body 15 is moved up and down with the wafers W held within the supporting frame 14, the wafers W and the chuck 40a are not brought into contact with the holding portion 18, as shown in FIGS. 13 and 14.

The lower supporting body 15 is moved up and down by the lift means 23 positioned below the treating vessel 30 as shown in FIG. 2, as already pointed out. The lift means 23 comprises a ball screw 23b which extends vertically and is rotated by a stepping motor 23a, and an operating rod 23d joined to a movable member 23c which is engaged with the ball screw 23b. If the operating rod 23d is moved upward, the lower supporting body 15 is also moved upward. Likewise, a downward movement of the operating rod 23d causes the lower supporting body 15 to be moved downward. To be more specific, the lower supporting body 15 is moved upward if the operating rod 23d of the lift means 23 is moved upward with the cradles 10a and 10b positioned close to each other while assuming an upright posture so as to allow the supporting frame 14 to receive 50 wafers from the wafer chuck 40a (FIG. 13).

The operating rod 23d is rotatable relative to the movable member 23c. A rotary actuator 23e is joined to a lower end portion of the operating rod 23d. When the operating rod 23d is rotated by the rotary actuator 23e, a hook 23f mounted to an upper end portion of the operating rod 23d is engaged with an engaging portion 15a formed in a lower surface of the lower supporting body 15, as shown in FIG. 13. In short, the operating rod 23d can be moved up and down by allowing the lift means 23 to be engaged with or disengaged from the lower supporting body 15. Specifically, the operating rod 23d can be moved up and down by allowing the hook 23f to be engaged with the engaging portion 15a. Also, after the lower supporting body 15 is moved down, the operating rod 23d can be moved further downward by disengaging the hook 23f from the engaging portion 15a. It follows that the rotor 2 and the cradles 10a, 10b can be rotated smoothly within horizontal planes during the drying treatment of the wafers W.

As shown in FIGS. 10, 12, 16 and 17, the cradle 10a is provided with rollers 24 positioned on both side portions. Each of these rollers 24 is capable of rolling along a guide rail 25 to permit the cradle 10a to be moved toward or away from the other cradle 10b. The guide rail 25 extends in the Y-axis direction and is fixed to the side wall 11 of the hood 12. The rollers 24 are rolled by a driving means (not shown) to permit the cradle 10a to be moved toward or away from the other cradle 10b.

Figure 16:
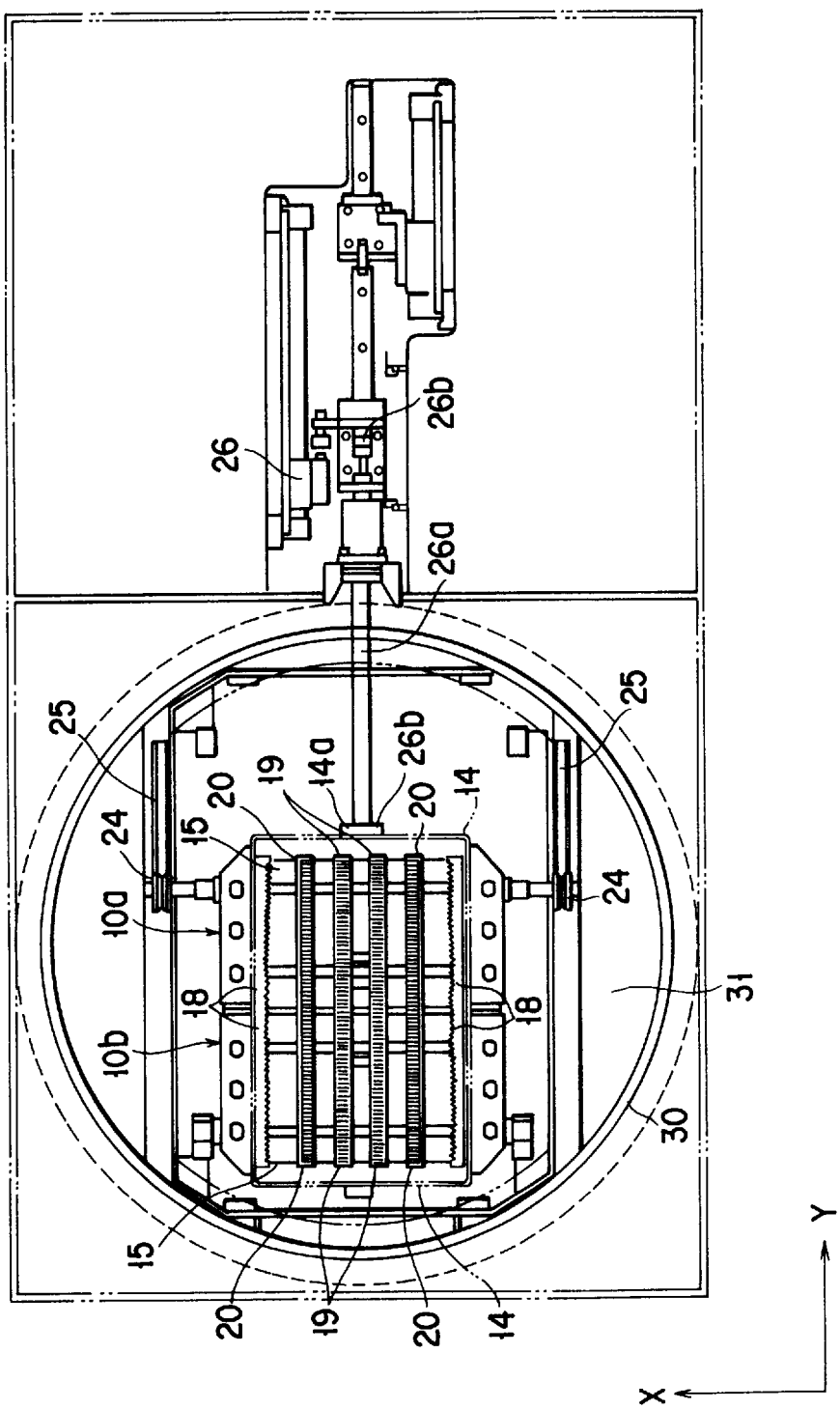
FIG. 16 is a plan view showing the holding means receiving a wafer.

As shown in FIG. 16, a hook 26b capable of engagement with the engaging portion 14a formed in a side portion of the supporting frame 14 of the cradle 10a is formed in a tip portion of a piston rod 26a included in a moving cylinder 26. The.hook 26b can be engaged with or disengaged from the engaging portion 14a by the rotary actuator 26c joined to the piston rod 26a. By allowing the hook 26b to be engaged with the engaging portion 14a, the piston rod 26a of the moving cylinder 26 is allowed to extend so as to move the cradle 10a toward the other cradle 10b. Also, after the wafers W are transferred onto the cradles 10a, 10b, the piston rod 26a is allowed to shrink so as to permit the cradle 10a to be set at a position a predetermined distance apart from the other cradle 10b. If the hook 26b is disengaged from the engaging portion 14a so as to permit the piston rod 26a to be retreated further after movement of the cradle 10a to the predetermined position noted above, the piston rod 26a ceases to interfere with the rotations of the rotor 2 and the cradles 10a, 10b.

As shown in FIGS. 17 and 10, a projecting shaft 27 is mounted at a position deviant from the axis of rotation of each of the cradles 10a, 10b on one side of each of these cradles. The projecting shaft 27 is pushed up by a push-up member 28a joined to a push-up cylinder 28 so as to cause each of these cradles 10a, 10b to assume an upright posture. When the push-up member 28a is moved downward so as to disengage the projecting shafts 27 from the cradles 10a, 10b, these cradles holding the wafers W are inclined by their own weight to make an angle of about 15° with a horizontal plane. It is desirable for the angle of inclination of the cradles 10a, 10b relative to the horizontal plane to fall within a range of between 10° and 40°. If the angle of inclination is smaller than 10°, the wafers W tend to run forward out of the cradles when rotation of the rotor 2 is stopped. If the angle of inclination is greater than 40°, however, the cradles 10a, 10b may fail to assume a horizontal posture during rotation of the rotor 2.

As described previously, the controller box 41 is mounted obliquely upward of the ninth treating unit 69. Housed in the controller box 41 a controller (not shown) for controlling the servo motor 1, stepping motor 23a, moving cylinder 26, rotary actuators 23e, 26c, push-up cylinder 28 and an openable cylinder 39. The controller housed in the controller box 41 continuously permits, for example, the servo motor 1 to be started, stopped and rotated at a very low speed. The controller also permits the moving cylinder 26 and the openable cylinder 39 to be driven in an interlocking fashion so as to move the cradles 10a, 10b toward or away from each other and to cause the lid 32 to be opened or closed simultaneously. It follows that it is possible to shorten the preparative time both before and after the drying treatment. Further, since the treating time ranging between the water-washing treatment and the rotational drying treatment can be shortened, it is possible to prevent the surface of the wafer W from bearing water marks.

Let us describe the treating vessel 30 more in detail. As shown in FIGS. 5 and 3, the air inlet port 30a is formed in an upper portion of the treating vessel 30. A doughnut-shaped ceiling plate 34 having an air passageway 34a is arranged in the air inlet port 30a. A doughnut-shaped filter 35 is arranged above the ceiling plate 34. Further, a shielding guide plate 36 downwardly diminished in diameter toward the center is arranged above the filter 35. Since the ceiling plate 34, the filter 35 and the shielding guide plate 36 are arranged in the region of the air inlet port 30a, the air flowing from the outer circumferential region into the treating vessel 30 through the filter 35 is allowed to flow through the air passageway 34a into a region above the central portion of the treating vessel 30.

An ionizer 42 (static charge removing means) is disposed in the air passageway 30a of the treating vessel 30. The ionizer 42 is formed by disposing, for example, an emitter bar (not shown) and a plurality of electrodes (not shown) a predetermined distance apart from each other. The ionizer 42 is operated by a control section connected to a power source (not shown). It should be noted that the particles contained in the air flowing through the air inlet port 30a are electrostatically charged positive or negative. Also, an electric field is applied to the air when the air flows through the ionizer 42. It follows that the charged particles contained in the air are neutralized when the air flows through the air inlet port 30a. In other words, the ionized particles in the air are removed by the ionizer 42.

The upper lid 32 closing the air inlet port 30a of the treating vessel 30 is swingable about a hinge 37 so as to open or close the air inlet port 30a. To be more specific, the upper lid 32 is opened or closed by the reciprocating movement of the piston rod 39a of the openable cylinder 39 joined to a pivot 37a of the hinge 37 via an interlocking link 38. Mounted to the upper lid 32 are the doughnut-shaped ceiling 34, filter 35, shielding guide plate 36, ionizer 42 and a nozzle 43 for washing the treating vessel.

As shown in FIGS. 2 to 4, an exhaust port 30c is formed in a side portion of the treating vessel 30.

The exhaust port 30 extends upward from the bottom portion to reach a height equal to at least the height of the rotor 2. The exhaust port 30c is open at a position lower than the position of the cradles 10a, 10b. An exhaust duct 33 having a rectangular cross section is connected to the exhaust port 30c. Of course, the cross section of the exhaust duct 33 need not be limited to a rectangular shape. For example, the exhaust duct 33 may be formed to have an elliptical cross section.

As shown in FIG. 3, the exhaust duct 33 is connected to the exhaust port 30c via an elbow portion 33a. A partition plate 33b for a gas/liquid separation is arranged within the exhaust duct 33 such that the plate 33b extends downward from the elbow portion 33a. The exhaust air discharged from the treating vessel 30 is allowed to collide against the partition plate 33b so as separate the exhaust air into gaseous and liquid components. The partition plate 33b also serves to suppress occurrence of a turbulent flow (eddy flow) of the exhaust air, with the result that plate 33b is effective for inhibiting the reverse flow of the air back into the treating vessel 30 and for suppressing damage done to the wafers W. The liquid component separated by the partition plate 33b flows into a drain pipe 33c arranged in a lower portion of the treating vessel 30 so as to be discharged to the outside. On the other hand, the separated gaseous component is discharged to the outside through a discharge pipe 33d communicating with a side portion of the exhaust duct 33a.

A chamber exhaust pipe 9 is disposed separately from the discharge pipe 33d. The dust generated within a cabinet 8 housing the servo motor 1, lift means 23, openable cylinder 39, etc. is discharged to the outside through the chamber exhaust pipe 9, as shown in FIGS. 2 and 4. Also, a shaft exhaust pipe 9a communicates with the clearance between the main shaft 3 of the rotor 2 and the seal cover 7, as shown in FIG. 5. The particles generated in the clearance between the main shaft 3 and the seal cover 7 are discharged to the outside by an ejector 9b communicating with the shaft exhaust pipe 9a (see FIGS. 2 and 5).

Figure 9:
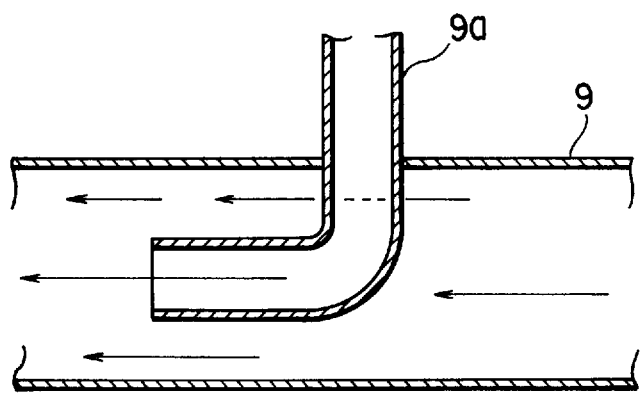
FIG. 9 is a cross sectional view showing the junction in which an end portion of a shaft exhaust pipe is inserted into and a chamber exhaust pipe.
Figure 11:
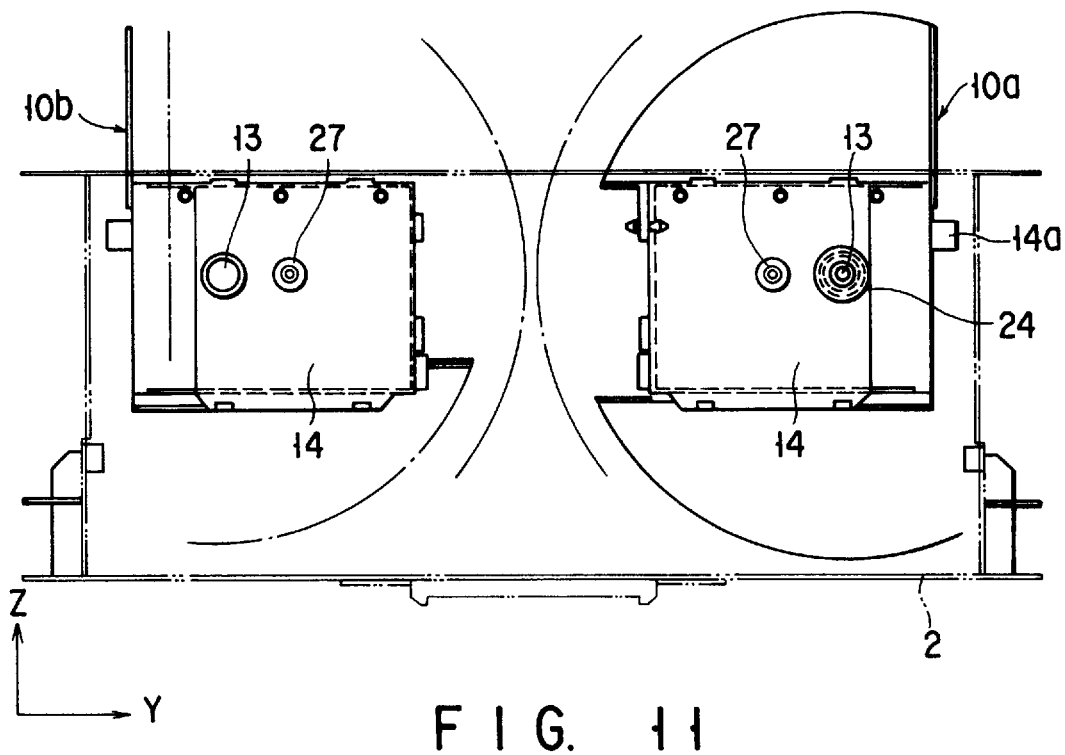
FIG. 11 is a front view schematically showing the holding means for holding substrates.
Figure 12:
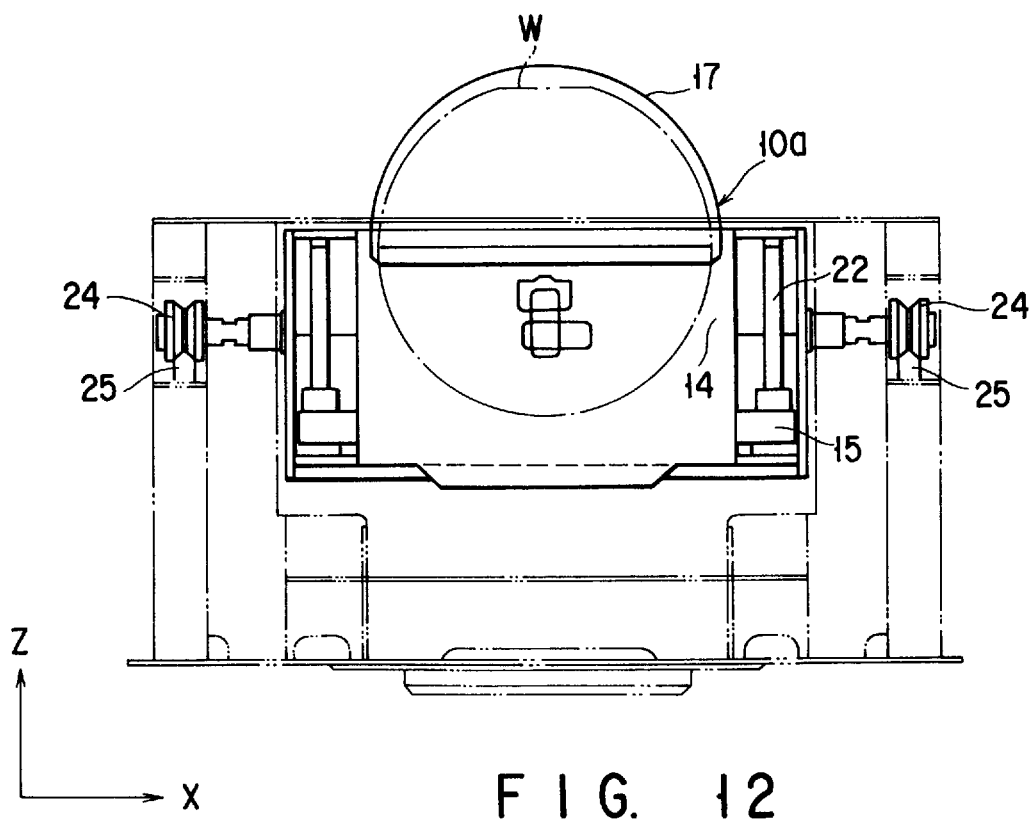
FIG. 12 is a side view schematically showing the holding means.

As shown in FIG. 9, the end portion at the discharge side of the shaft exhaust pipe 9a is inserted into the chamber exhaust pipe 9. As apparent from the drawing, the shaft exhaust pipe 9a is much smaller in diameter than the chamber exhaust pipe 9. Naturally, the flowing speed of the exhaust gas within the shaft exhaust pipe 9a is higher than that of the exhaust gas within the chamber exhaust pipe 9. It follows that the exhaust gas within the chamber exhaust pipe 9 is sucked by the exhaust gas coming out of the shaft exhaust pipe 9a so as to promote the flow of the exhaust gas within the chamber exhaust pipe 9. Also, since the shaft exhaust pipe 9a is inserted into the chamber exhaust pipe 9, it is possible to diminish the piping space. It should be noted that the end portion of the shaft exhaust pipe 9a is bent toward the exhaust air flowing direction with the chamber exhaust pipe 9. The bending in the particular direction permits the pipe 9a to ensure the sucking of the exhaust air flowing within the chamber exhaust pipe 9. In addition, the exhaust gas flowing within the chamber exhaust pipe 9 is prevented from flowing backward into the cabinet 8.

Figure 19B:
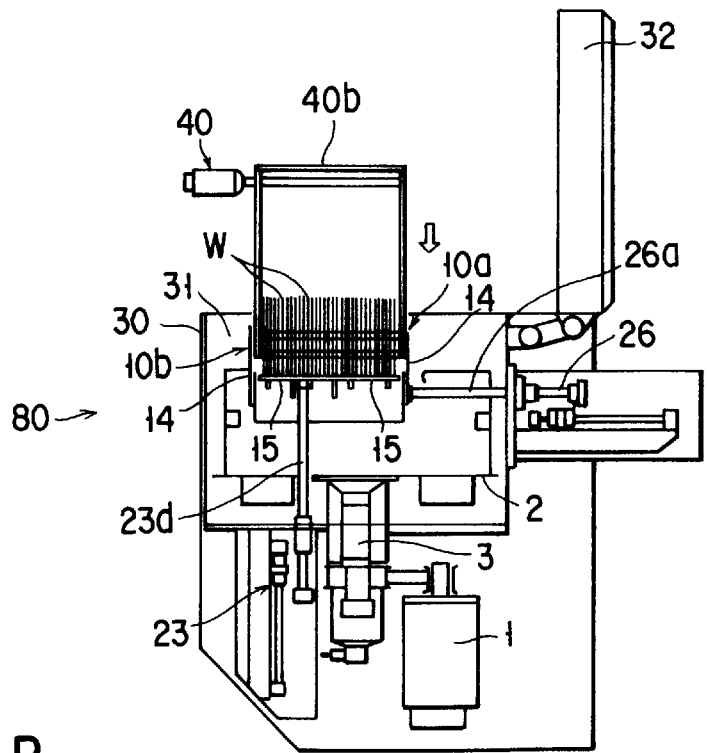
Figure 19C:
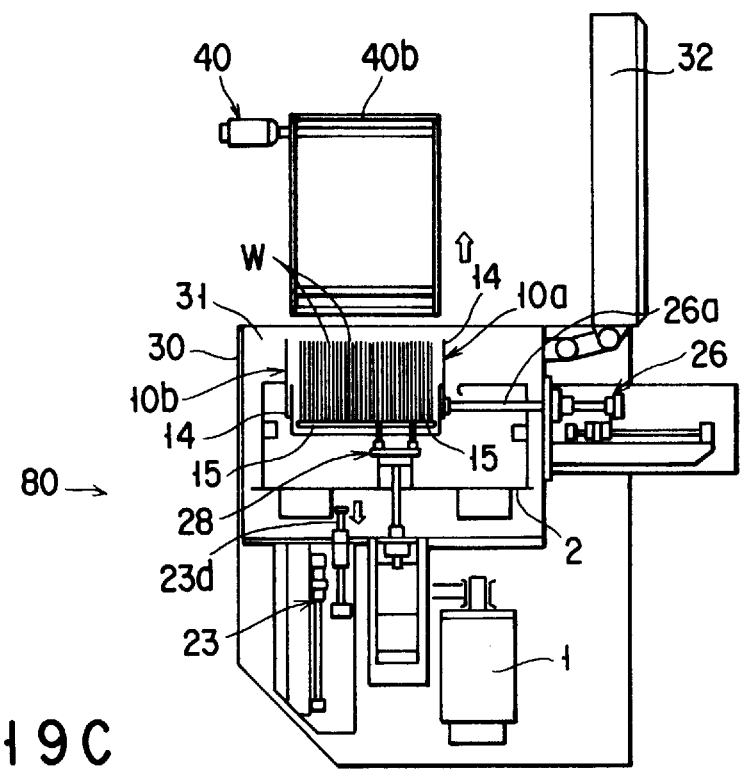

FIGS. 19A to 19J and 20 collectively show how the spin dryer 80 of the construction described above is operated. In the first step, a rod 26a of a Y-axis moving cylinder 26 is extended to move the cradle 10a toward the other cradle 10b. Under this condition, the operating rod 23d of the lift means 23 is extended so as to move upward the lower supporting body 15. As a result, the two lower supporting bodies 15 are rendered ready to receive 50 wafers W, as shown in FIG. 19A. Then, the wafer chuck 40b is moved downward so as to transfer the wafers W from the wafer chuck 40b onto the lower supporting body 15, followed by moving upward the wafer chuck 40b, as shown in FIGS. 19B and 19C. In this step, the operating rod 23d of the lift means 23 is moved downward to reach a waiting position below the treating vessel 30.

Figure 19D:
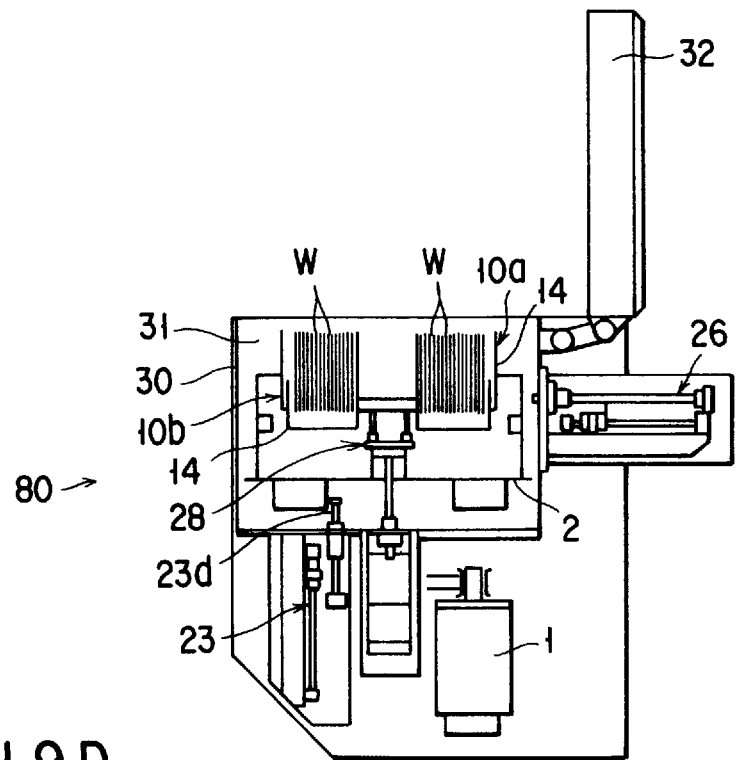

In the next step, the rod 26a of the Y-axis moving cylinder 26 is retreated so as to move the cradle 10a away from the other cradle 10b. As a result, the cradles 10a and 10b are positioned in symmetry with respect to the axis of the rotor 2. In this step, the openable cylinder 39 is driven so as to close the upper lid 32, as shown in FIGS. 19D and 19E. Under this condition, the rod 26a of the Y-axis moving cylinder 26 is disengaged from the cradle 10a so as to be brought back to its waiting position. Also, the push-up member 28a of the push-up cylinder 28 is moved downward so as to permit the cradles 10a, 10b to be inclined by 10° to 40° relative to a horizontal plane.

Then, the servo motor 1 is driven so as to permit the rotor 2 and the cradles 10a, 10b held thereon to be rotated within horizontal planes. As a result, the cradles 10a, 10b are centrifugally allowed to assume a horizontal posture. In this step, the air stream flows from the central portion toward the outer circumferential side through the clearances among adjacent wafers. It follows that the water droplets attached to the wafers W are removed so as to dry the surfaces of the wafers W, as shown in FIG. 19F.

Figure 20:
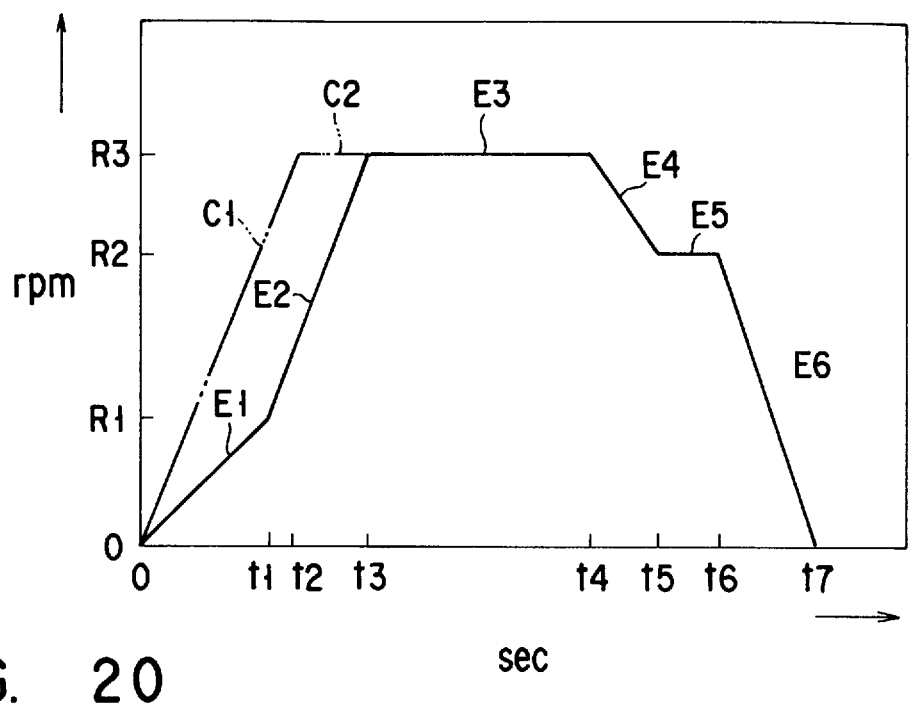
FIG. 20 is a graph showing the change with time in the rotating speed of the rotating section of a spin dryer in respect of the method of the present invention and the conventional method.

FIG. 20 is a graph showing how the angular speed of the rotor 2 is controlled during the drying treatment. As seen from the graph, the rotor 2 is rotated at a low acceleration during a first acceleration period E1 between the start up time and time t1 (sec) to reach an angular speed R1 (rpm). Then, the acceleration is increased during a second acceleration period E2 during time t1 and time t3 to reach an angular speed R3. The angular speed of the rotor 2 is maintained constant at R3 in a succeeding constant angular speed period E3 during time t3 and time t4, followed by decreasing the angular speed to R2 in a first deceleration period E4 during time t4 and time t5. After the rotor 2 is rotated at a constant angular speed R2 in another constant angular speed period E5 during time t5 and time t6, the angular speed of the rotor 2 is decreased to zero in a second deceleration period E6 during time t6 and time t7 so as to stop rotation of the rotor 2. In this embodiment, the maximum angular speed R3 is set at 800 rpm and maintained for about 280 seconds during the period E3.

Suppose the rotor 2 is started up at a high acceleration such that the angular speed of the rotor 2 reaches the maximum value R3 in a short time t2 from the start up, as denoted by imaginary lines C1, C2 in FIG. 20. In this case, the wafers W are vibrated and, thus, tend to be damaged. To avoid this difficulty, it is necessary to increase the angular speed of the rotor 2 at a low acceleration in the first acceleration period E1. Incidentally, it is possible to decrease linearly the angular speed from the maximum speed R3 to zero in the latter periods E4 to E6.

Figure 19G:
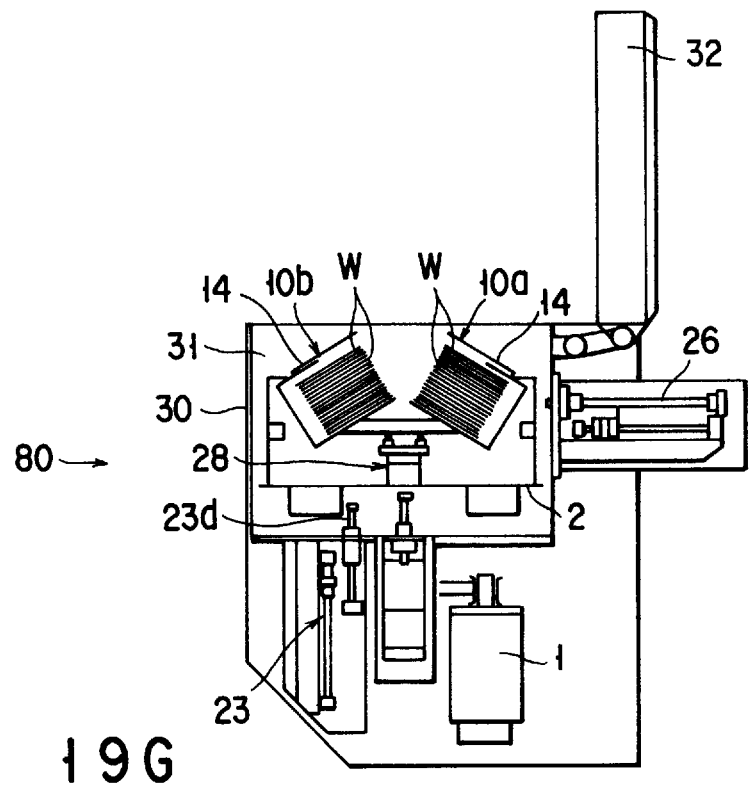
Figure 19H:
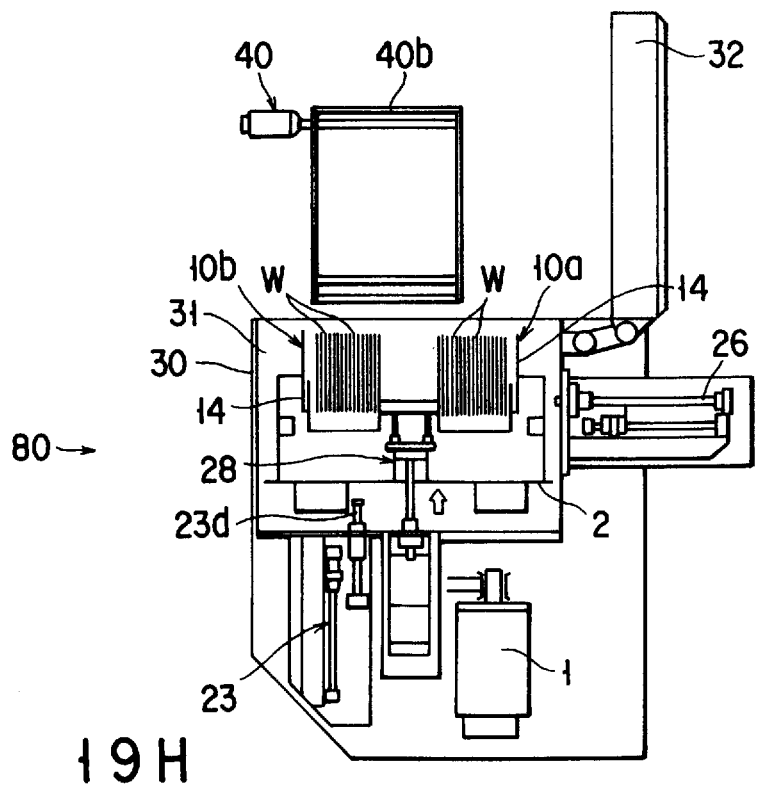
Figure 19I:
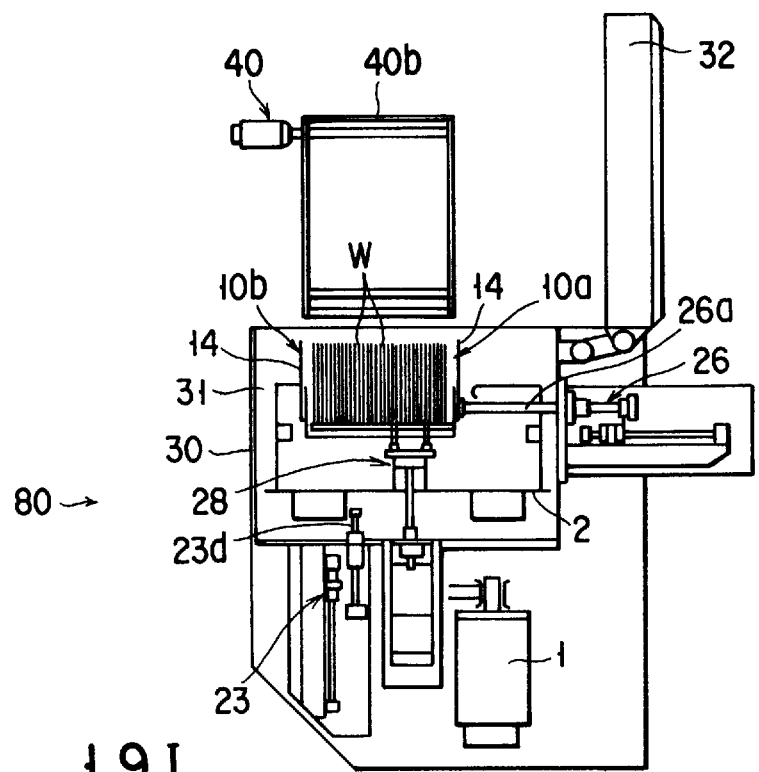

After rotation of the rotor 2 and the cradles 10a, 10b held thereon is stopped as shown in FIG. 19G, the push-up member (rod) 28a is moved upward so as to allow the cradles 10a, 10b to assume an upright posture, as shown in FIG. 19H. Under this condition, the piston rod 26a of the Y-axis moving cylinder 26 is allowed to be engaged with the cradle 10a and to be extended so as to move the cradle 10a toward the other cradle 10b, as shown in FIG. 19I.

Figure 19J:
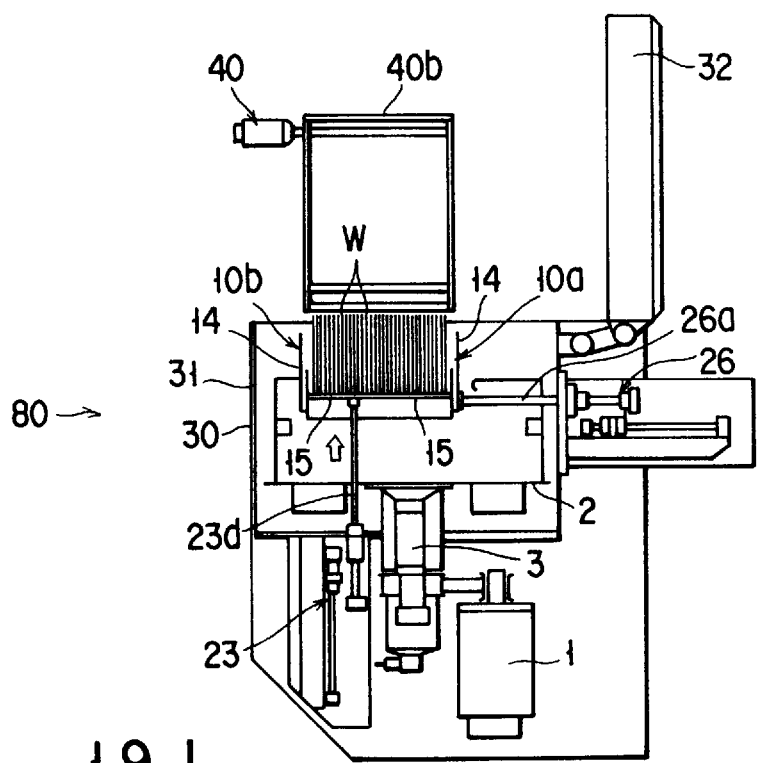

Further, the operating rod 23d of the lift means 23 is engaged with the lower supporting body 15 and, then, moved upward so as to move upward the cradles 10a, 10b, the lower supporting body 15 and the wafers W held thereon, as shown in FIG. 19J. Under this condition, the wafer transfer device 40 is positioned in the ninth treating unit 69 so as to allow the wafer chuck 40b to hold the wafers W after the drying treatment, thereby transferring the wafers W out of the spin dryer 80.

Figure 21A:
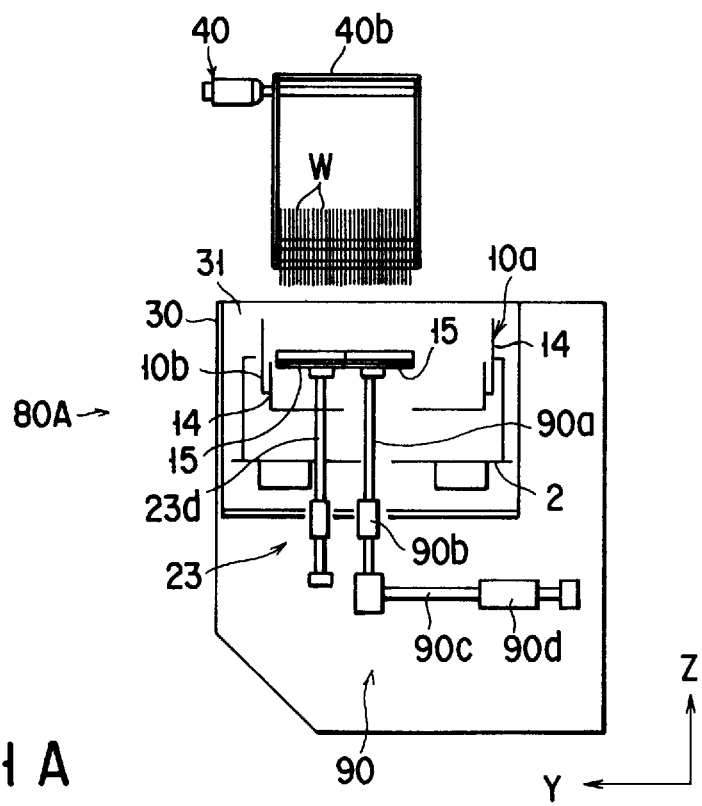

FIGS. 21A to 21C collectively show a spin dryer 80A according to another embodiment of the present invention. In this embodiment, the spin dryer 80A comprises first and second lift mechanisms 23, 90. The first lift mechanism 23 is substantially equal to the lift mechanism included in the spin dryer 80 described previously. The second lift mechanism 90 includes a vertical cylinder 90b, a horizontal cylinder 90d, and rods 90a, 90b. If the rod 90a is protruded upward from the vertical cylinder 90b, the lower supporting body 15 on one side is pushed up from the supporting frame 14.

The tip portion of the rod 90c of the horizontal cylinder 90d is joined to the lower end of the vertical cylinder 90b. If the rod 90c is pushed rightward or leftward in the drawing from the horizontal cylinder 90d, the lower supporting body 15 on said one side, which is supported by the vertical rod 90a, is moved toward or away from the other lower supporting body 15. Since 50 wafers are collectively transferred in this embodiment, the lower supporting body 15 on said one side is moved toward or away from the other lower supporting body 15. Also, the cradles 10a and 10b are positioned in symmetry with respect to the center of rotation of the rotor 30.

The spin dryer 80A constructed as described above is operated as follows. In the first step, the other lower supporting body 15 is upheaved from the cradle 10b by the first lift mechanism 23. Also, the lower supporting body 15 on said one side is upheaved from the cradle 10a by the second lift mechanism 90, followed by moving the upheaved lower supporting body 15 in the Y-axis direction shown in the drawing such that these two lower supporting bodies 15 are positioned close to each other so as to assume a posture ready for receiving the wafers W, as shown in FIG. 21A. Under this condition, the wafer chuck 40b is moved downward so as to permit the wafers W to be transferred collectively from the wafer chuck 40b onto the two lower supporting bodies 15, followed by moving upward the wafer chuck 40b to its waiting position.

The lower supporting body 15 is on one side is moved in the direction of Y-axis by the second lift mechanism 90, as shown in FIG. 21B. Further, each of the first and second lift mechanisms 23, 90 is moved downward so as to move downward the wafers W together with the lower supporting body 15. As a result, the wafers W are housed in the cradles 10a, 10b, as shown in FIG. 21C. At the same time, the openable cylinder 39 driven to close the upper lid 32. Further, the wafers W are subjected to a spin drying treatment as in the embodiment described previously.

In each of the embodiments described above, the spin dryer of the present invention is incorporated into a wafer washing-drying system. Needless to say, however, the spin dryer of the present invention can be used as an independent apparatus.

Also, the spin dryer of the present invention is used for drying semiconductor wafers in each of the embodiments described above. However, the spin dryer can also be used for drying substrates other than semiconductor wafers such as glass substrates or substrates for LCDs.

The present invention produces prominent effects as summarized below. First of all, since the drying air can be efficiently introduced into a central region of the upper mechanism of the rotor and can be distributed to the substrates arranged within each cradle, the drying air can be effectively utilized, making it possible to achieve a spin drying treatment of substrates with a high efficiency.

Also, a gas-liquid separation means is arranged within an exhaust gas passageway, making it possible to dispose of the exhaust gas and exhaust liquid separately. In addition, it is possible to suppress damages done to the substrate by the back stream of waste drying air flowing from the exhaust side.

Also, the drying air can be introduced from the outer circumferential region to form a down-stream flowing toward the central region of the spin dryer. Then, the air stream flows from the central region of the rotor toward the outer circumferential region so as to be brought into contact uniformly with the substrates held by the support means rotated below the substrates. It follows that the drying air can be utilized more efficiently.

Also, the ionized particles within the drying air can be neutralized in the present invention. As a result, the particles in the drying air are prevented from being attached electrostatically to the substrates, leading to a further improved yield.

Also, the bottom of the treating vessel is inclined downward from the central region toward the exhaust port formed in the outer peripheral region. As a result, the liquid droplets centrifugally separated from the substrate are discharged rapidly from within the treating vessel, leading to a further improved through-put.

Also, the end portion of the shaft exhaust pipe is inserted into the chamber exhaust pipe such that the exhaust gas within the shaft exhaust pipe is combined with the exhaust gas within the chamber exhaust pipe. Also, the exhaust gas within the chamber exhaust pipe is sucked by the exhaust gas stream discharged from the shaft exhaust pipe so as to prevent the particles or the like from being transferred from the rotary shaft of the rotor into the rotor. Also, the volume of the exhaust system is decreased so as to miniaturize the apparatus. Further, the exhaust gas can be discharged from within the chamber without fail, making it possible to prevent the exhaust gas from flowing backward into the chamber.

Further, the end portion of the shaft exhaust pipe inserted into the chamber exhaust pipe is bent toward the downstream side of the chamber exhaust pipe. As a result, the exhaust gas within the chamber exhaust pipe is sucked by the flow of the exhaust gas discharged from the shaft exhaust pipe. It follows that the reverse flow of the exhaust gas back into the treating chamber can be prevented without fail.

In the present invention, a hood having vertical side walls is mounted to the rotor, and the support means is of a cylindrical structure having an air passageway. The particular construction permits effectively utilizing the drying air while simplifying the construction of the apparatus. Also, the water droplets centrifugally separated from the substrates are collected by the side walls and discharged outward, leading to an improved drying efficiency.

Also, a flow regulating plate substantially parallel with both the side wall of the hood and the wall portion of the support means is arranged between these side wall and wall portion so as to regulate the air flow. Also, the flow regulating plate serves to prevent the particles from entering the region where the substrates are arranged, leading to a further improved drying efficiency.

Also, an air inlet port is formed in a position facing the center of rotation of the rotor, and an exhaust port is formed in a part of the side wall of the treating vessel in a manner to extend upward from the bottom of the treating chamber to reach a portion equal to at least the height of the rotor. The particular construction permits the drying air to be taken into the treating chamber from the central portion of the rotor so as to flow uniformly into the clearances between adjacent substrates to be dried. Further, the liquid droplets centrifugally separated from the substrates can be discharged toward the exhaust port.

The lower supporting body for supporting the lower portion of the substrate is movable in the present invention in a vertical direction relative to the supporting frame. Therefore, the substrate can be transferred to and from the cradle by moving upward the lower supporting body. Also, the substrate can be held by the lower supporting body and the holding portion of the supporting frame, with the lower supporting body held at the lowered positioned. Therefore, the construction can be simplified. Also, since the contact area with the substrate can be diminished and the transfer and holding of the substrate can be ensured, it is possible to prevent particle generation and contamination. In addition, the yield can be increased. Further, the upper supporting body for supporting the upper side of the substrate can be fixed, making it possible to support the substrate during rotation more stably.

Also, the supporting portion of the lower supporting body comprises a pair of first rods for supporting the substrate at two points deviant from the lowermost point of the substrate and a pair of second rods for supporting the substrate at two points positioned outward of the two points supported by the first rods. Thus, the substrate can be supported more stably, while effectively releasing to the outside the water droplets attached to the substrate.

The lower end portion of the substrate is supported by the grooves formed in the first rods, said groove having a V-shaped cross section, and that portion of the substrate which is positioned somewhat upward of the portion supported by the first rods is supported by the grooves formed in the second rods, said groove having a V-shaped cross section. Also, the lateral movement of the substrate is regulated by the grooves. It follows that the contact area with the substrate can be markedly diminished, making it possible to prevent the particle generation and substrate contamination without fail.

Also, at least the supporting base portion is formed of an aluminum alloy, and the surface of the aluminum alloy is impregnated with a fluoroplastic material. It follows that the lower supporting body can be made lighter in weight and is enabled to exhibit a corrosion resistance, leading to a longer life of the apparatus.

Further, the supporting means can be moved by a moving means, and the lid of the treating chamber housing the rotor and the supporting means can be opened/closed by an opening/closing means. In addition, the lid can be opened or closed simultaneously with movement of the supporting means. It follows that the preparatory period both before and after the drying treatment can be shortened. In addition, the through-put can be increased. Also, since the time between the water-wash treatment and the drying treatment by rotation can be shortened, it is possible to prevent the substrate surface from bearing water marks.

Still further, rotation of the rotor is started at a low angular speed, followed by rotating the rotor at a high angular speed. The particular operation mode permits alleviating the impact given to the substrate at the start-up time, leading to an improved yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A spin dryer for centrifugally removing water droplets attached to a plurality of substrates, comprising:

a rotor having a main shaft formed in a lower portion;

substrate holding device configured to hold a plurality of substrates such that main surfaces of the substrates are perpendicular to the main shaft of the rotor, said holding device being positioned in symmetry with respect to the main shaft of the rotor and rotated together with the rotor;

a treating vessel surrounding the rotor and the substrate holding device;

an air inlet port formed in an upper portion of the treating vessel and configured to introduce air into a region about the center rotation of said rotor; and an exhaust port configured to exhaust the air toward the outer circumferential region of the rotor, said exhaust port being formed in a side portion of the treating vessel in a manner to extent upward from the bottom portion of the treating vessel to reach at least the height position of the rotor.

2. The spin dryer according to claim 1, further comprising:

an exhaust duct communicating with said exhaust port; and a gas/liquid separating member arranged within said exhaust duct for separating a liquid component from the exhaust gas discharged from said treating vessel.

3. The spin dryer according to claim 1, further comprising:

a ceiling plate mounted in said air inlet port and having an air passageway formed in the central portion;

an annular filter mounted above said ceiling plate; and a shielding guide plate positioned above said annular filter and inclined downward from the outer peripheral region toward the center thereof.

4. The spin dryer according to claim 1, further comprising:

a static charge removing means mounted within said air inlet port for neutralizing the charged particles contained in the air introduced into the treating chamber.

5. The spin dryer according to claim 1, wherein the bottom of the treating chamber is gradually inclined downward in the rotating direction of the rotor and is also inclined downward from the central portion toward said exhaust port.

6. The spin dryer according to claim 1, wherein said substrate holding device comprises:

at least a pair of contact supporting members each having a plurality of grooves formed for holding each substrate, at least one pair of cradles engaged with said contact supporting member, rotated integrally with said rotor, and swingably supported such that the posture assumed by the substrate supported therein can be changed; and first relative moving means for relatively moving said cradles in horizontal direction.

7. The spin dryer according to claim 1, wherein said substrate holding device comprises:

a contact supporting member each having a plurality of grooves formed for holding each substrate; and a cradle engaged with said contact supporting member, rotated integrally with said rotor, and swingably supported such that the posture assumed by the substrate supported therein can be changed;

said spin dryer further comprises lift means for lifting said contact supporting member away from said cradle.

8. The spin dryer according to claim 1, wherein said substrate holding device comprises:

at least a pair of contact supporting member each having a plurality of grooves formed for holding each substrate; and at least one pair of cradles engaged with said contact supporting member, rotated integrally with said rotor, and swingably supported such that the posture assumed by the substrate supported therein can be changed;

said spin dryer further comprises;

first lift means for lifting one of said contact supporting member away from one of said cradles;

second lift means driven independently of said first lift means for lifting the other contact supporting member from the other cradle; and second relative moving means for relatively moving said first and second lift means in horizontal direction.

9. The spin dryer according to claim 1, wherein said substrate holding device comprises:

at least a pair of contact supporting members each having a plurality of grooves formed for holding each substrate, and at least one pair of cradles engaged with said contact supporting member, rotated integrally with said rotor, and swingably supported such that the posture assumed by the substrate supported therein can be changed;

said spin dryer further comprises first relative moving means for relatively moving said cradles in horizontal direction, and lift means for lifting said contact supporting member away from said cradle.

10. A spin dryer for centrifugally removing water droplets attached to a plurality of substrates, comprising:

a rotor having a main shaft formed in a lower portion;

rotating means for rotating said rotor;

a chamber having said rotating means housed therein;

at least a pair of substrate holding means for holding a plurality of substrates such that main surfaces of the substrates are perpendicular to the main shaft of the rotor, said holding means being positioned in symmetry with respect to the main shaft of the rotor and rotated together with the rotor;

a treating vessel surrounding the rotor and the substrate holding means;

an air inlet port formed in an upper portion of the treating vessel for introducing air into the treating vessel;

an exhaust port formed in a side portion of the treating vessel in a manner to extend upward from the bottom portion of the treating vessel to reach at least the height position of the rotor;

an exhaust duct communicating with said exhaust port;

a shaft exhaust pipe communicating with a clearance between the main shaft of the rotor and a seal cover rotatably supporting said main shaft;

a chamber exhaust pipe communicating with at least a chamber housing said rotating means, the open end portion of said shaft exhaust pipe being inserted into said chamber exhaust pipe such that the exhaust air stream within said shaft exhaust pipe is combined with the exhaust air stream within the chamber exhaust pipe.

11. The spin dryer according to claim 10, wherein said open end portion of the shaft exhaust pipe is bent within the chamber exhaust pipe such that the exhaust air stream discharged from the shaft exhaust pipe flows in the flowing direction of the exhaust air stream within the chamber exhaust pipe.

12. A spin dryer for centrifugally removing water droplets attached to a plurality of substrates, comprising:

a rotor rotated by rotating means;

at least a pair of substrate holding means for holding a plurality of substrates, said substrate holding means being arranged in symmetry with respect to a shaft of the rotor; and a hood mounted to the rotor and having a pair of side walls linearly covering the side portions of said substrate holding means, wherein said substrate holding means comprises:

a side wall portion parallel with said side walls of said hood; and an air passageway open in a radial direction of said rotor.

13. The spin dryer according to claim 12, wherein a flow regulating plate is arranged between and in parallel with the side wall of the hood and the wall portion of the substrate holding means.

14. A spin dryer for centrifugally removing water droplets attached to a plurality of substrates, comprising:

a rotor rotated by rotating means;

at least a pair of substrate holding means for holding a plurality of substrates, said substrate holding means being arranged in symmetry with respect to a shaft of the rotor;

a treating vessel surrounding said rotor and said substrate holding means; and a hood mounted to the rotor and having a pair of side walls linearly covering the side portions of said substrate holding means, wherein,
said substrate holding means comprises:
a side wall portion parallel with said side walls of said hood; and
an air passageway open in a radial direction of said rotor, and
said treating vessel comprises:
an air inlet port formed in a portion facing the center of rotation of said rotor; and
an exhaust port formed in a side portion of the treating vessel in a manner to extend upward from the bottom portion of the treating vessel to reach at least the height position of the rotor.

15. The spin dryer according to claim 14, wherein a water releasing hole is formed in that portion of the side wall of the hood which is positioned on the rear side in the rotating direction of the rotor.

16. The spin dryer according to claim 14, wherein a shielding guide plate covering the exposed surfaces of the substrates supported by the substrate holding means is mounted to an edge portion of the substrate holding means.

17. A spin dryer for centrifugally removing water droplets attached to a plurality of substrates, comprising:
a rotor rotated by rotating means;
at least a pair of substrate holding means for holding a plurality of substrates, said substrate holding means being arranged in symmetry with respect to a shaft of the rotor;
relative moving means for relatively moving said substrate holding means;
inclining means for inclining each of said substrate holding means;
a lower supporting body mounted to said substrate holding means and provided with a plurality of grooves for holding a lower portion of each of said substrates;
a supporting frame provided with a plurality of grooves for holding peripheral side portions of the substrate; and
lift means for moving upward said lower supporting body relative to said supporting frame.

18. The spin dryer according to claim 17, wherein said lower supporting body comprises two first holding rods for holding the substrate at two lower points somewhat deviant from the lowest end and two second holding rods for holding the substrate at two points somewhat outside the points held by said first holding rods.

19. The spin dryer according to claim 18, wherein said first holding rod is provided with grooves each having a V-shaped cross section, and said second holding rod is provided with grooves each having a portion moderately inclined outward and contiguous to a V-shaped central portion.

20. The spin dryer according to claim 17, wherein:
said lower supporting body comprises two first holding rods for holding the substrate at two lower points somewhat deviant from the lowest end and two second holding rods for holding the substrate at two points somewhat outside the points held by said first holding rods; and at least said supporting base portion is formed of an aluminum alloy and has a surface region impregnated with a fluoroplastic material.

21. A spin dryer for centrifugally removing water droplets attached to a plurality of substrates, comprising:
a rotor rotated within a horizontal plane by rotating means;
at least a pair of supporting means for supporting a plurality of substrates, said supporting means being capable of inclination and arranged in symmetry with respect to a shaft of the rotor;
a treating chamber having an upper opening and housing said rotor and said supporting means;
a lid positioned to close said upper opening of the treating chamber;
moving means for moving said supporting means; and
opening/closing means for opening/closing said lid,
wherein, when said supporting means is moved by said moving means, said lid is opened/or closed by said opening/closing means.

22. A method of drying a plurality of substrates by centrifugally removing water droplets attached to said substrates, comprising the steps of:
(a) collectively receiving in a treating chamber a plurality of cassettes each housing a plurality of substrates equidistantly arranged to stand upright to assume a vertical posture;
(b) classifying the received substrates into at least two groups;
(c) changing the posture assumed by the substrates of each group from said vertical posture to a horizontal posture;
(d) starting rotation of the substrates of all the groups at a first angular acceleration; and
(e) continuing to rotate the substrates of all the groups at a second angular acceleration higher than said first angular acceleration until the angular speed of the substrate reaches a predetermined maximum angular speed.

23. The method according to claim 22, further comprising the step of rotating the substrate at a first angular deceleration after said maximum angular speed of the substrate is maintained for a predetermined period of time.

24. The method according to claim 23, wherein said first angular deceleration is followed by a second angular deceleration at which the substrate is rotated until the rotation of the substrate is stopped.

25. The method according to claim 24, wherein the angular deceleration of the substrate is temporarily made zero during transition from said first angular deceleration to said second angular deceleration.

26. The method according to claim 22, wherein an exhaust air is discharged sideward in a position below the substrate while supplying a drying air from above onto the substrate in each of steps (d) and (e).

* * * * *